(12) United States Patent
Hong et al.

(10) Patent No.: US 12,382,641 B2
(45) Date of Patent: *Aug. 5, 2025

(54) SPIN LOGIC DEVICE BASED ON SPIN-CHARGE CONVERSION AND SPIN LOGIC ARRAY USING THE SAME

(71) Applicants: INDUSTRY-ACADEMIC COOPERATION FOUNDATION, YONSEI UNIVERSITY, Seoul (KR); INDUSTRY-UNIVERSITY COOPERATION FOUNDATION HANYANG UNIVERSITY ERICA CAMPUS, Ansan (KR)

(72) Inventors: Jongill Hong, Seoul (KR); Saeroonter Oh, Ansan (KR)

(73) Assignees: INDUSTRY-ACADEMIC COOPERATION FOUNDATION, YONSEI UNIVERSITY, Seoul (KR); INDUSTRY-UNIVERSITY COOPERATION FOUNDATION HANYANG UNIVERSITY ERICA CAMPUS, Ansan (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/455,449

(22) Filed: Aug. 24, 2023

(65) Prior Publication Data

US 2023/0403865 A1 Dec. 14, 2023

Related U.S. Application Data

(63) Continuation of application No. 16/875,415, filed on May 15, 2020, now Pat. No. 11,785,783.

(30) Foreign Application Priority Data

May 17, 2019 (KR) ........................ 10-2019-0057679
Aug. 14, 2019 (KR) ........................ 10-2019-0099458
Jan. 15, 2020 (KR) ........................ 10-2020-0005462

(51) Int. Cl.
*H10B 61/00* (2023.01)
*H01F 10/32* (2006.01)
(Continued)

(52) U.S. Cl.
CPC .......... *H10B 61/00* (2023.02); *H01F 10/3254* (2013.01); *H01F 10/3272* (2013.01);
(Continued)

(58) Field of Classification Search
CPC . H10B 61/00; H01F 10/3254; H01F 10/3272; H01F 10/3286; H01F 10/329;
(Continued)

(56) References Cited

U.S. PATENT DOCUMENTS 5,629,549 A * 5/1997 Johnson ............... H10D 48/385
257/422
8,344,758 B2 * 1/2013 Javerliac ............... H10N 59/00
326/104
(Continued)

FOREIGN PATENT DOCUMENTS

CN 104425002 A * 3/2015 ............. B82Y 25/00
CN 107004440 A * 8/2017 ........... G11C 11/161
(Continued)

*Primary Examiner* — Mohammed Shamsuzzaman

(57) ABSTRACT

Disclosed are a spin logic device based on spin-charge conversion and a spin logic array using the same. A reconfigurable spin logic array according to an exemplary embodiment of the present invention may include: an input terminal receiving at least three current signals; a plurality of wires transmitting the current signal in connection with the input terminal and including a horizontal wire and a vertical wire which cross each other; a first gate array in which at least one first majority gate connected to the input terminal through the wires and implemented based on the spin logic device is arranged; and a second gate array in which at least (Continued)

one second majority gate connected to the first gate array through the wires and implemented based on the spin logic device is arranged.

9 Claims, 26 Drawing Sheets

(51) Int. Cl.
  *H03K 19/17728* (2020.01)
  *H03K 19/18* (2006.01)
  *H10N 50/80* (2023.01)
  *H10N 50/85* (2023.01)

(52) U.S. Cl.
  CPC ....... *H01F 10/3286* (2013.01); *H01F 10/329* (2013.01); *H03K 19/17728* (2013.01); *H03K 19/18* (2013.01); *H10N 50/80* (2023.02); *H10N 50/85* (2023.02)

(58) Field of Classification Search
  CPC .. H03K 19/17728; H03K 19/18; H10N 50/80; H10N 50/85; H10N 50/10; H10N 50/20
  See application file for complete search history.

(56) References Cited

U.S. PATENT DOCUMENTS

| | | | |
|---|---|---|---|
| 10,062,731 B2 | 8/2018 | Manipatruni et al. | |
| 10,283,561 B2* | 5/2019 | Wang | G11C 11/161 |
| 10,651,368 B2* | 5/2020 | Avci | H10B 61/00 |
| 2003/0227807 A1* | 12/2003 | Nakamura | G11C 11/1673 365/202 |
| 2004/0213042 A1* | 10/2004 | Johnson | G11C 11/16 365/158 |
| 2010/0073025 A1 | 3/2010 | Tanamoto et al. | |
| 2011/0044099 A1* | 2/2011 | Dieny | H01F 10/3254 365/171 |
| 2015/0085569 A1* | 3/2015 | Nozaki | B82Y 40/00 365/158 |
| 2018/0158588 A1* | 6/2018 | Manipatruni | H03K 19/16 |
| 2018/0175241 A1* | 6/2018 | Jain | H01L 29/127 |
| 2018/0240896 A1 | 8/2018 | Nikonov et al. | |
| 2018/0240964 A1 | 8/2018 | Nikonov et al. | |
| 2018/0301199 A1* | 10/2018 | Sasaki | H10N 50/10 |
| 2021/0148999 A1* | 5/2021 | Wang | G11C 11/1675 |

FOREIGN PATENT DOCUMENTS

| | | | | |
|---|---|---|---|---|
| CN | 108470826 A | * | 8/2018 | ......... H01L 27/2436 |
| KR | 20110106332 | | 9/2011 | |
| KR | 20170099862 | | 9/2017 | |
| KR | 20180022828 | | 3/2018 | |
| WO | WO-2016011435 A1 | * | 1/2016 | ........... G11C 11/161 |
| WO | WO-2016209226 A1 | * | 12/2016 | ........... G11C 11/155 |
| WO | WO-2017044095 A1 | * | 3/2017 | ........... G11C 11/161 |
| WO | WO-2017044109 A1 | * | 3/2017 | ............. H01L 43/04 |
| WO | WO-2017112959 A1 | * | 6/2017 | ........ H03K 19/0002 |
| WO | WO-2018125106 A1 | * | 7/2018 | ........ H03K 19/0002 |

* cited by examiner

[FIG. 1]
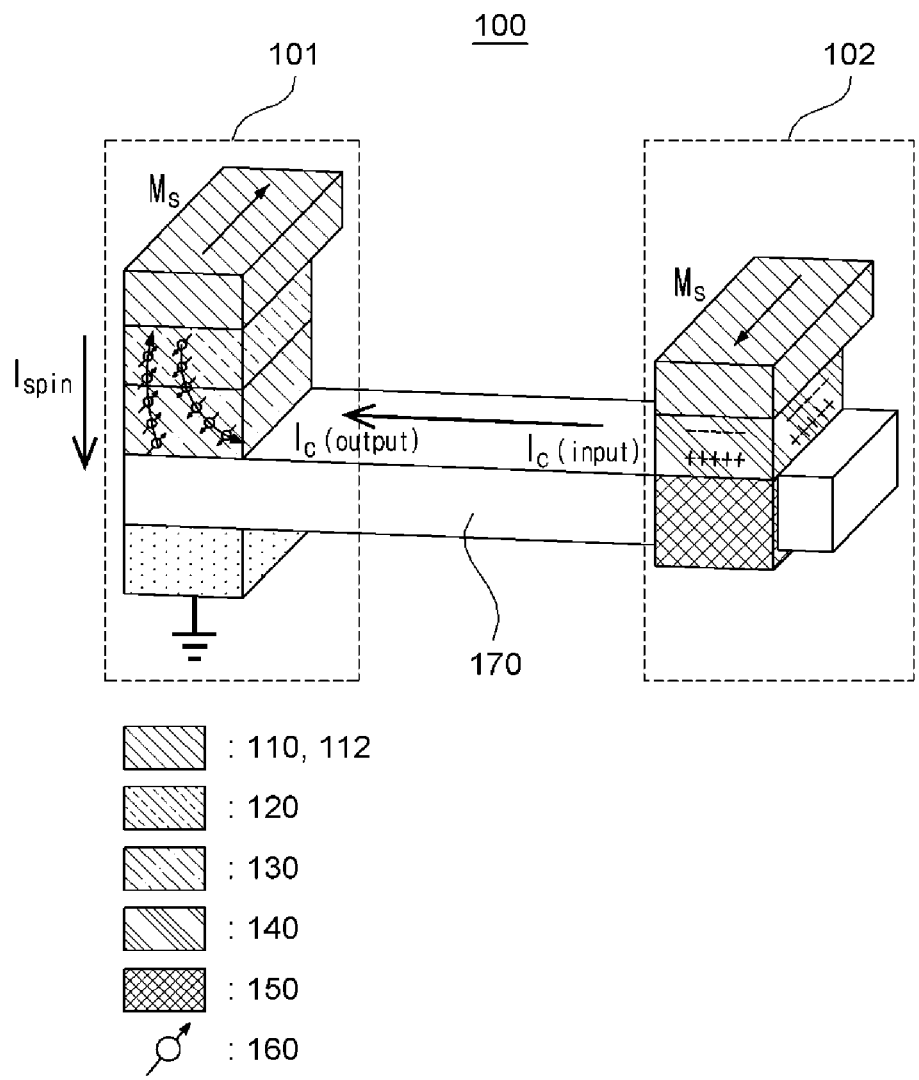

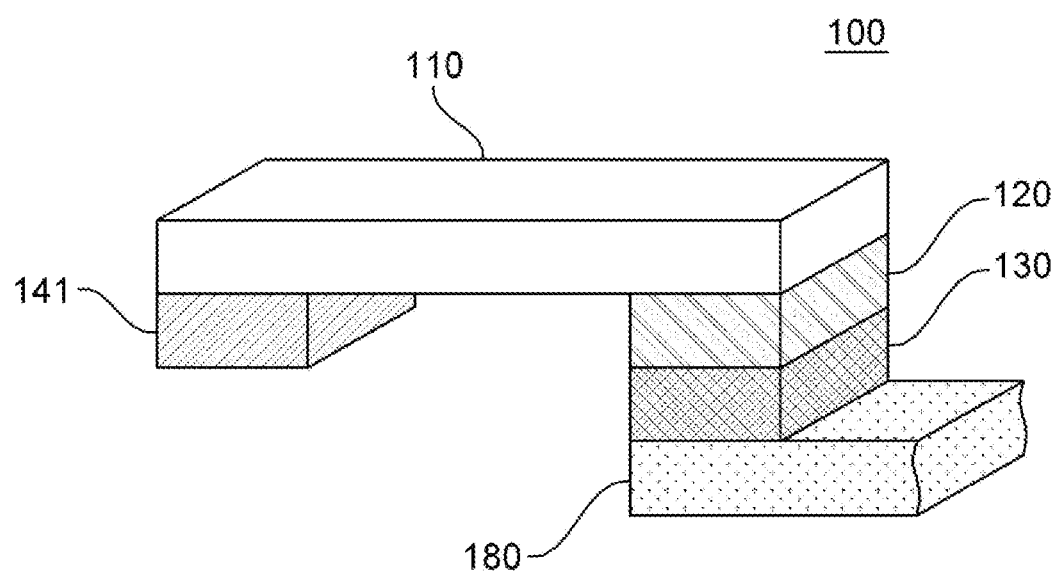
[FIG. 2A]

[FIG. 2B]
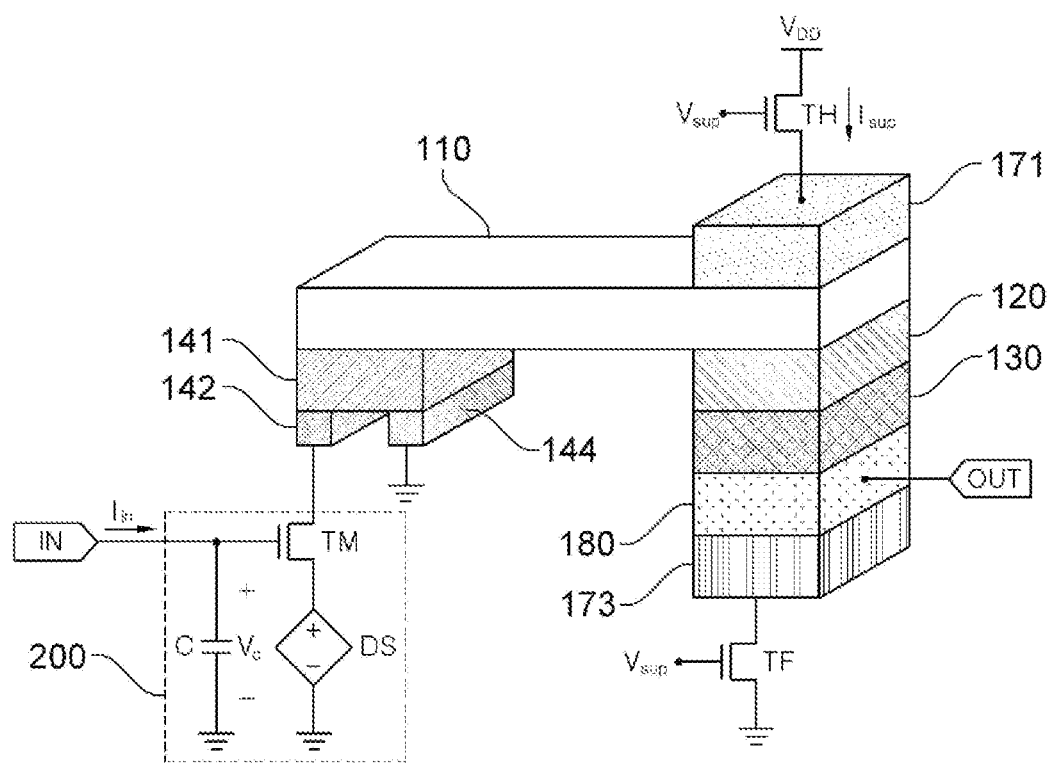

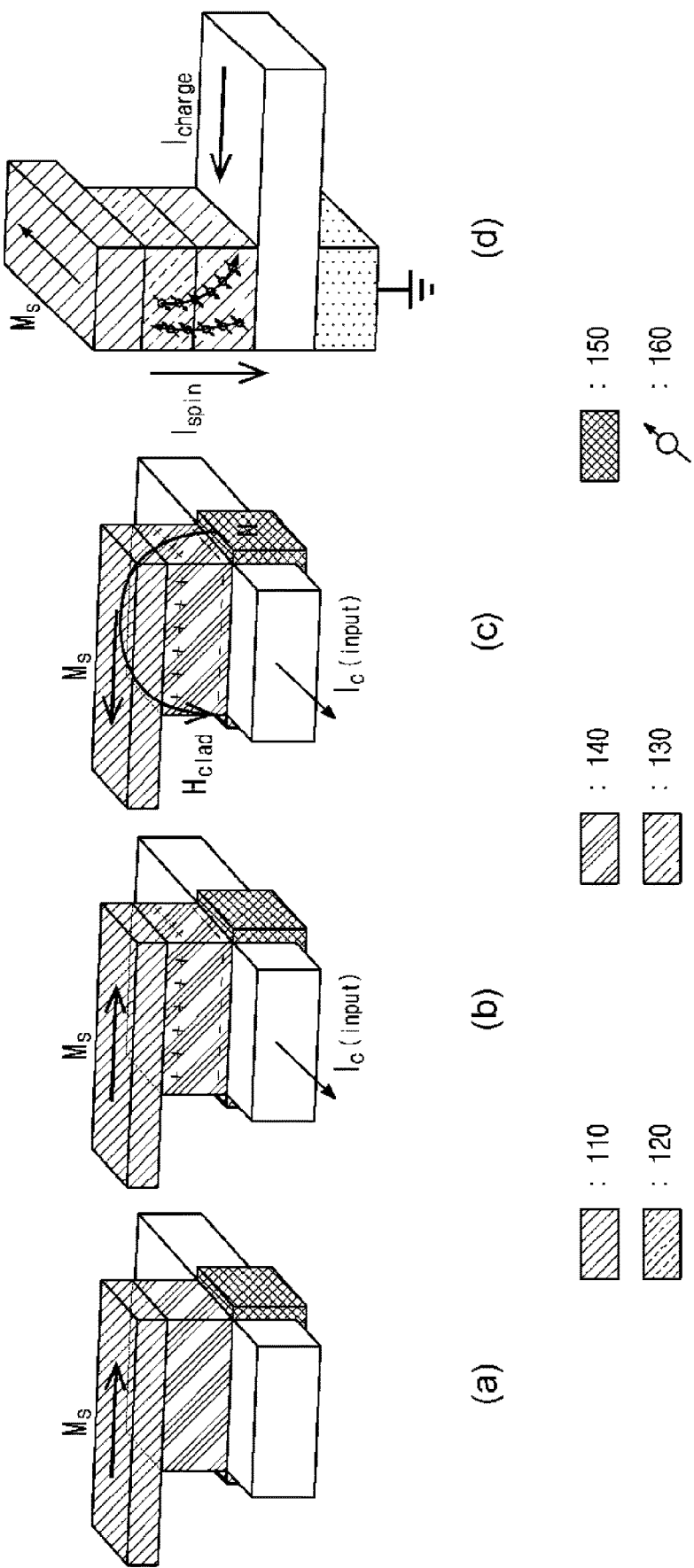
[FIG. 3]

[FIG. 4]
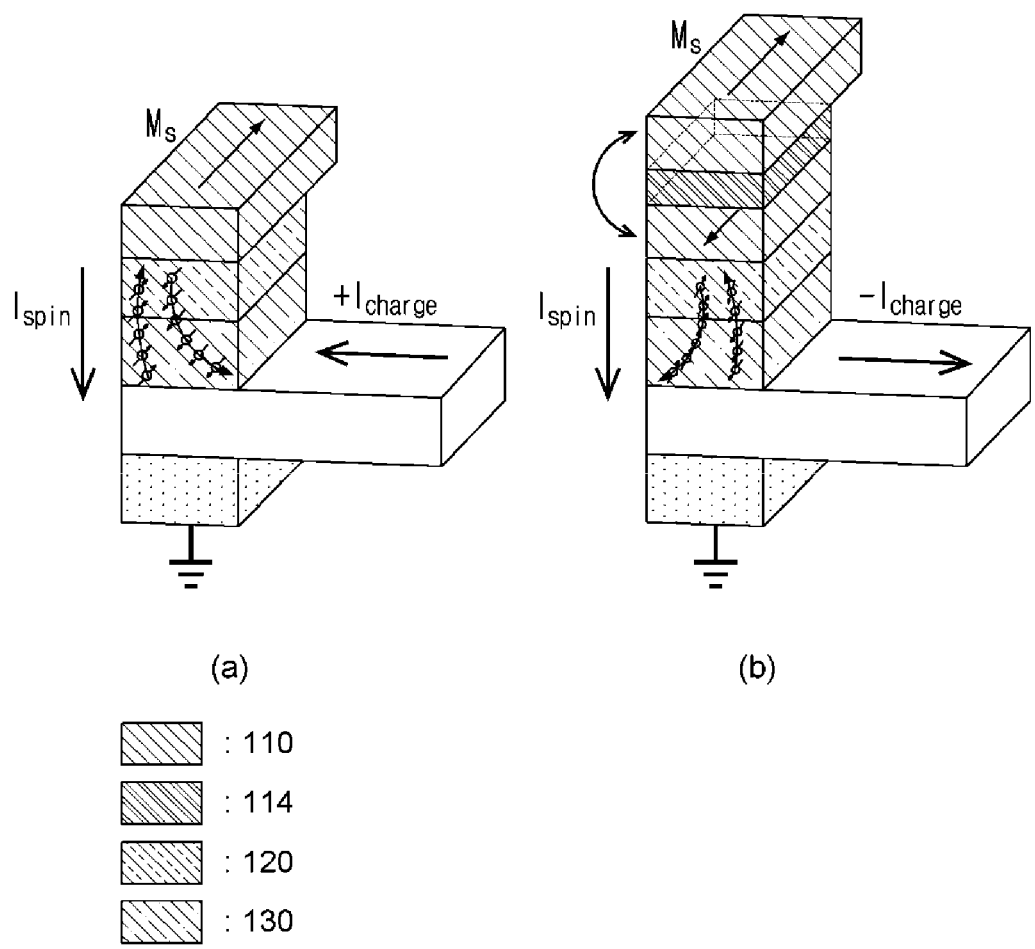

[FIG. 5A]
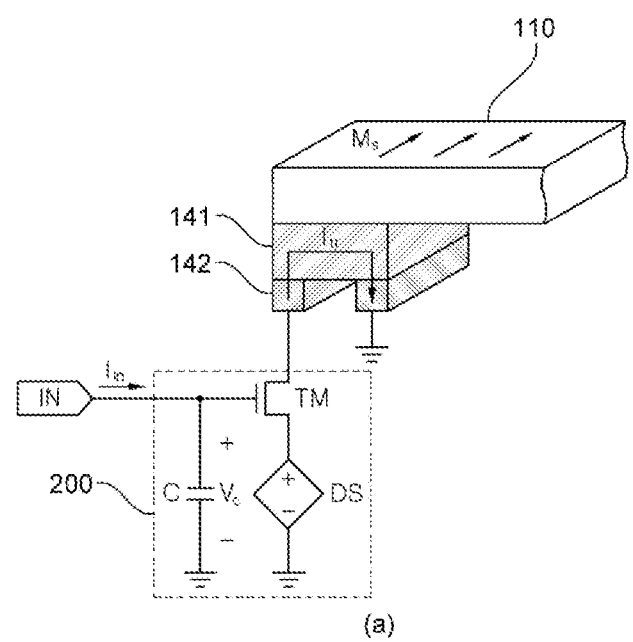
(a)
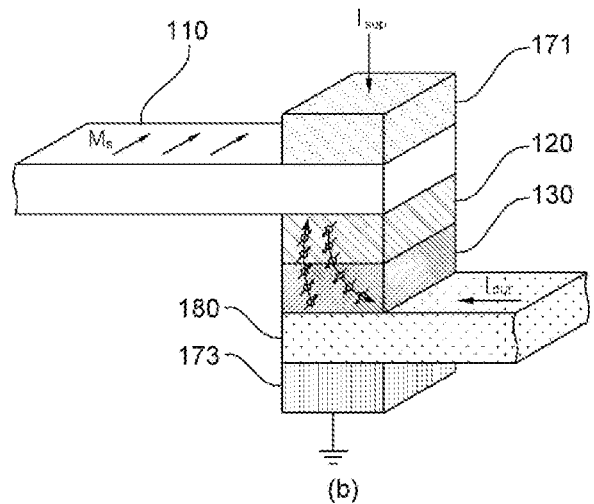
(b)

[FIG. 5B]
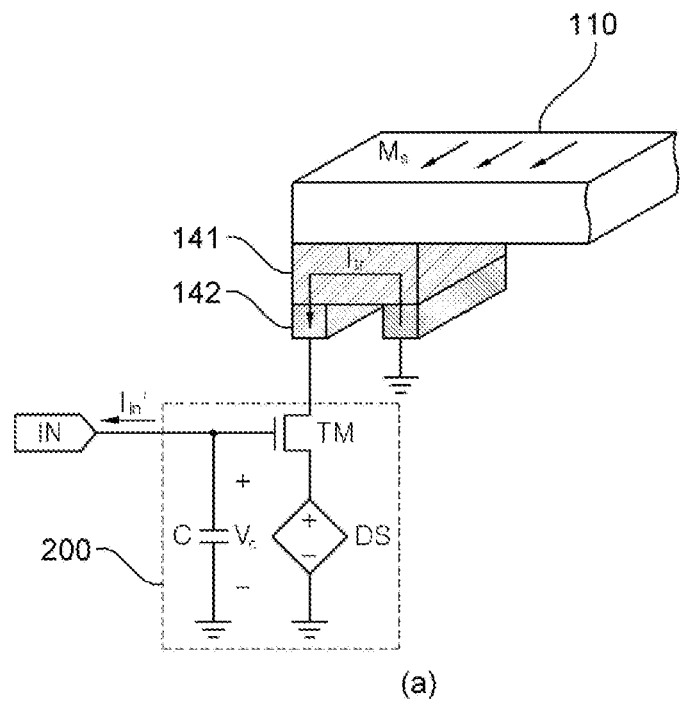
(a)
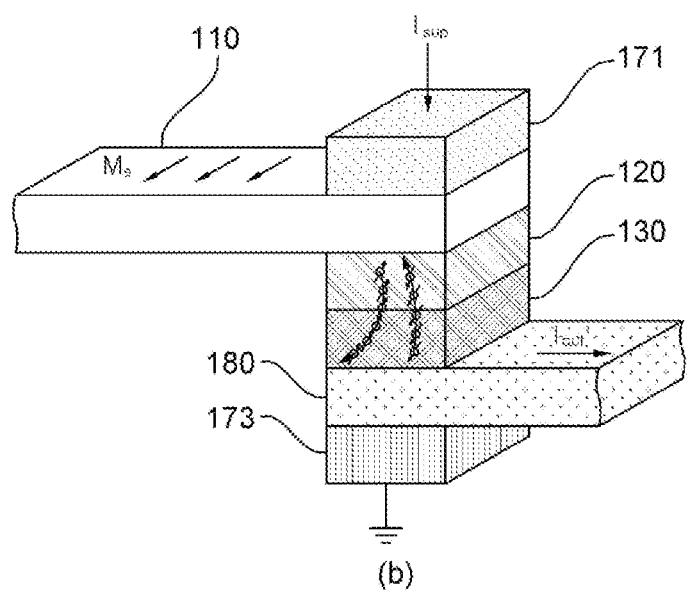
(b)

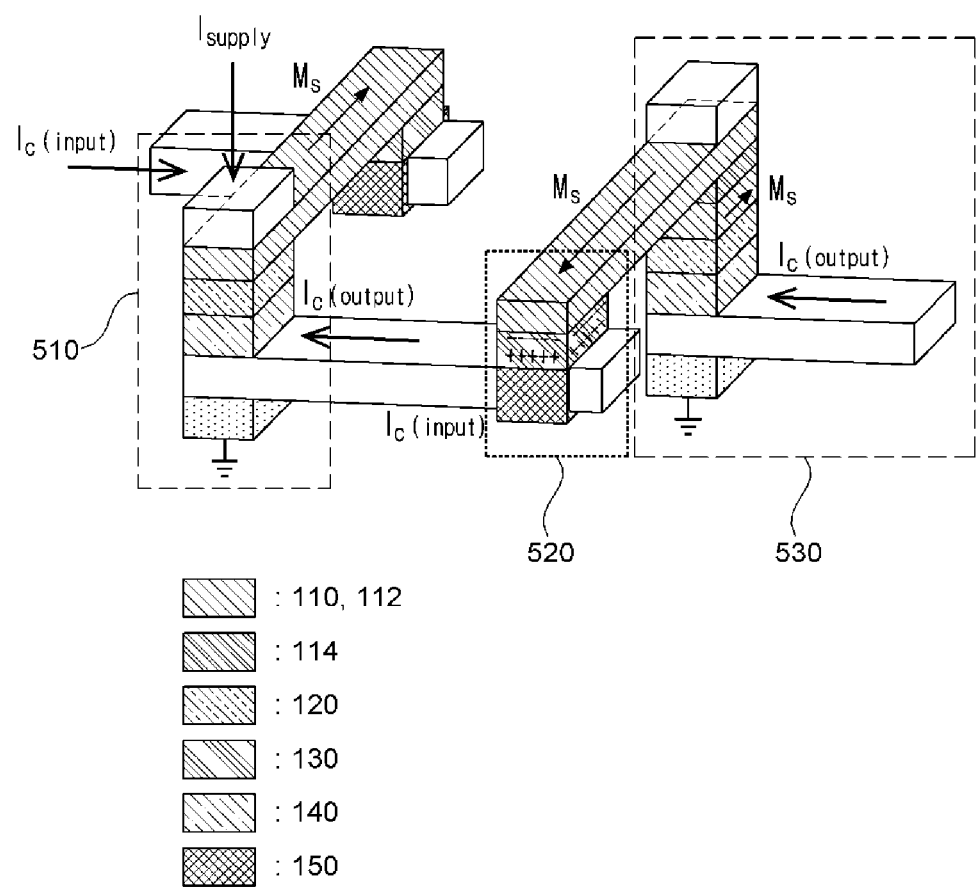
[FIG. 6]

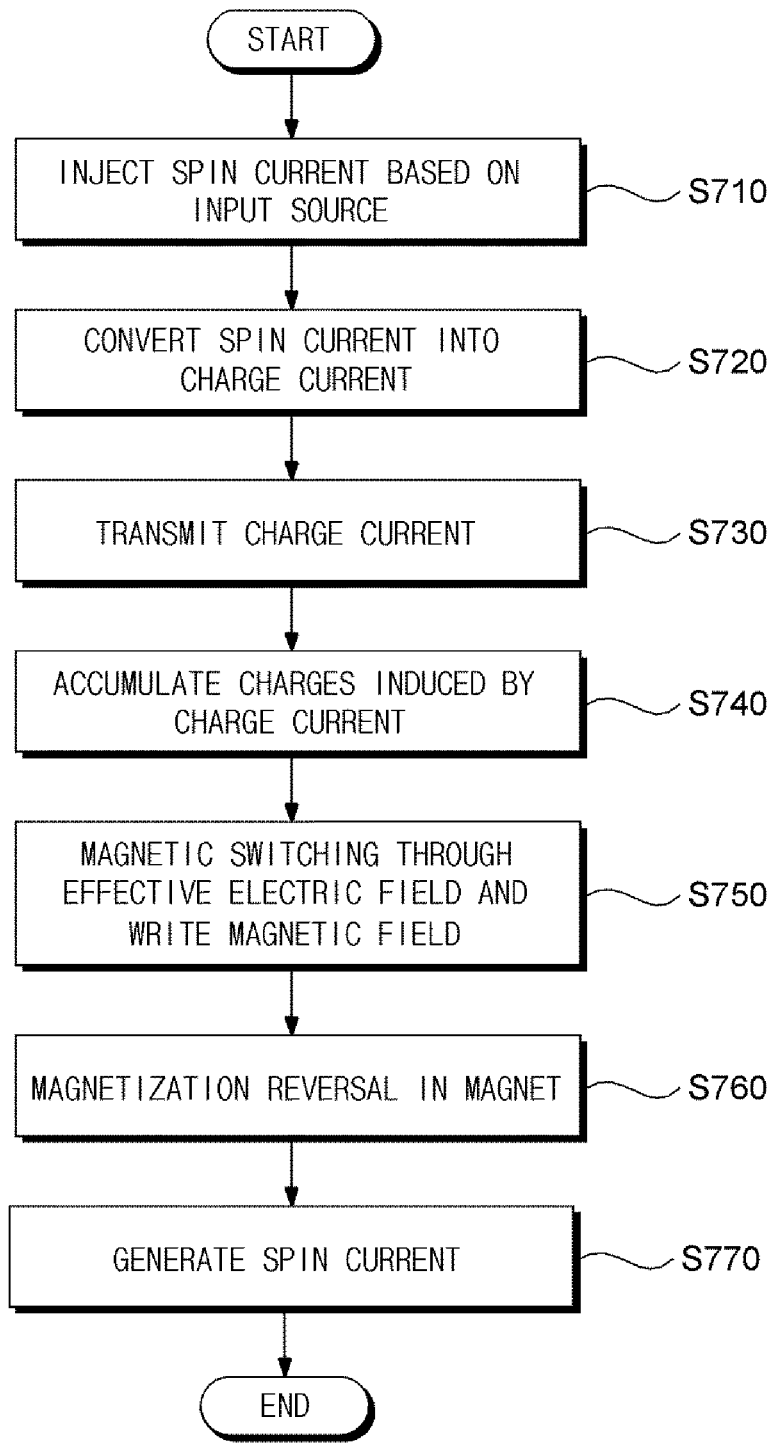

[FIG. 8A]
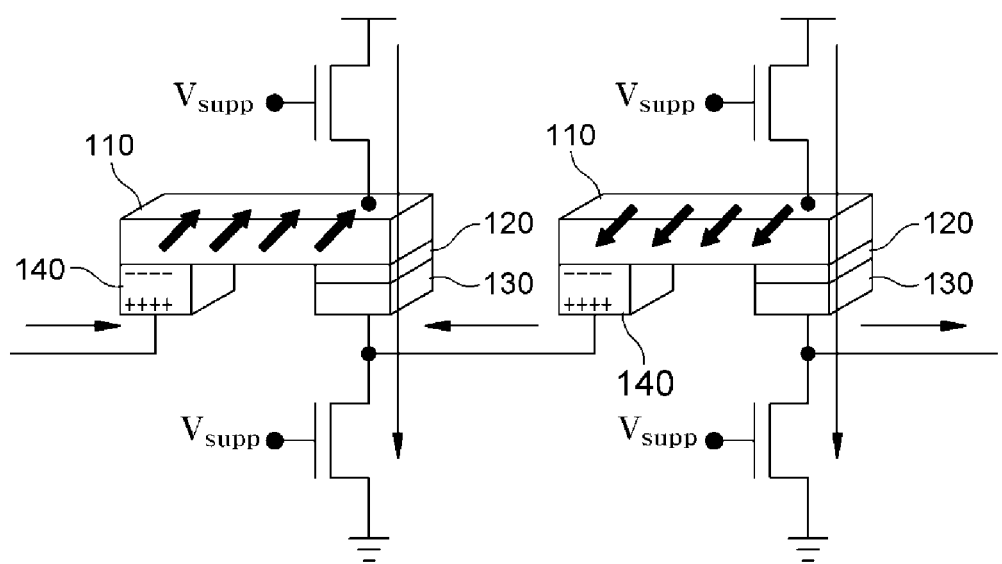

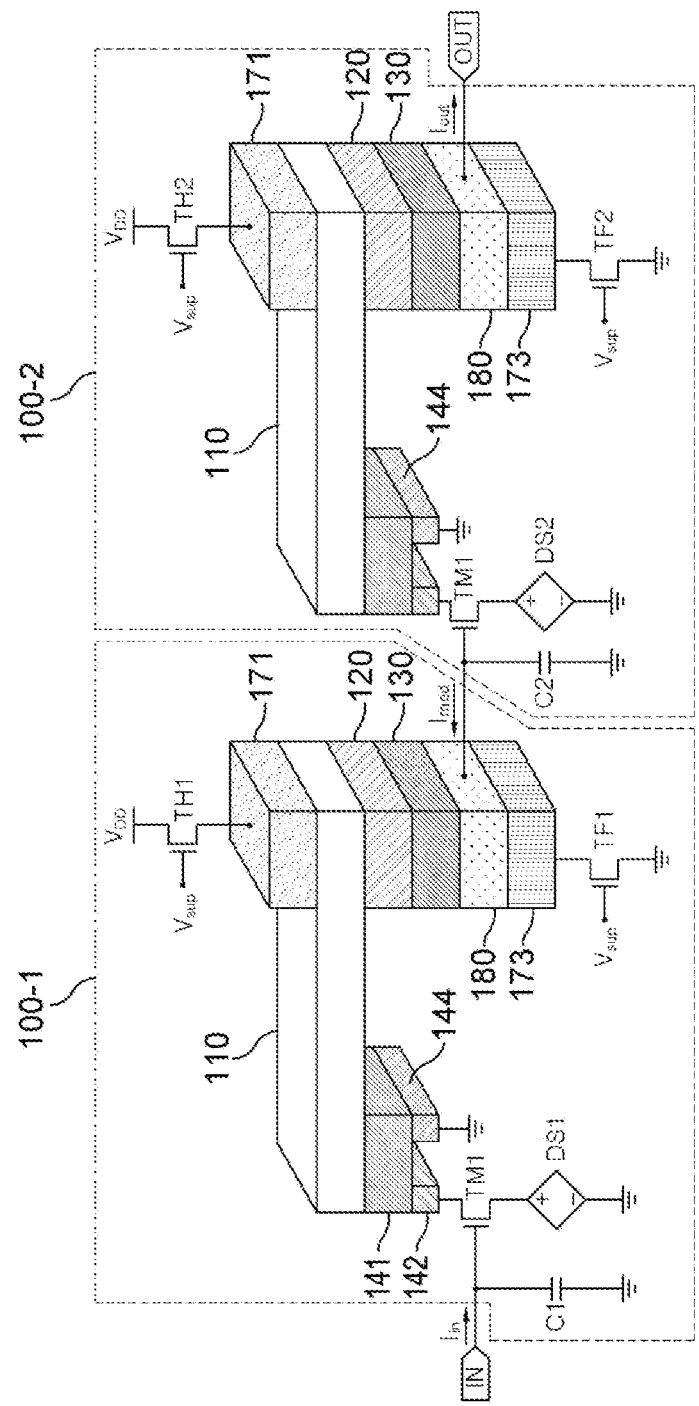
[FIG. 8B]

[FIG. 9A]
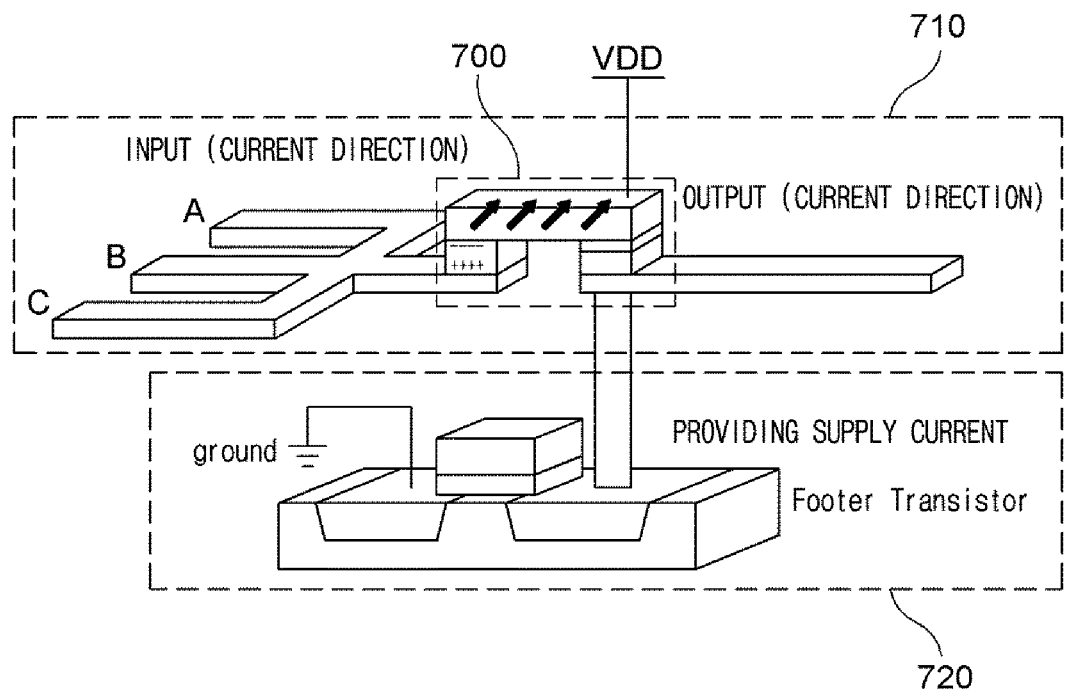

[FIG. 9B]
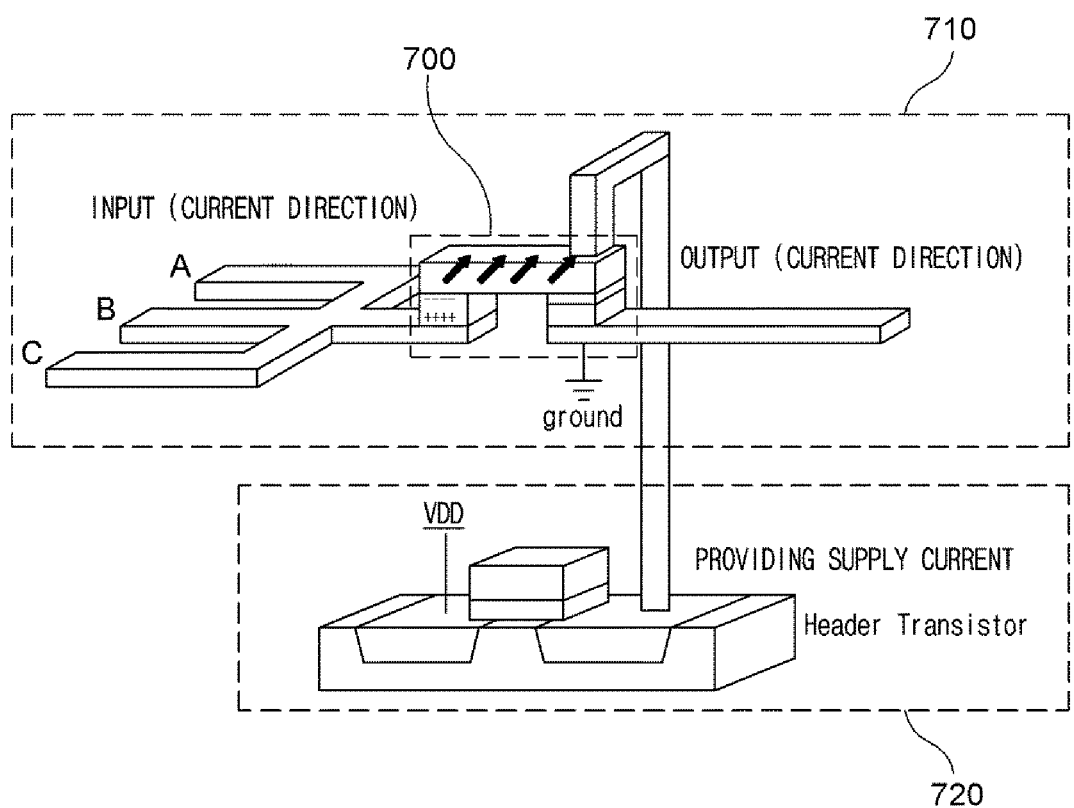

[FIG. 9C]
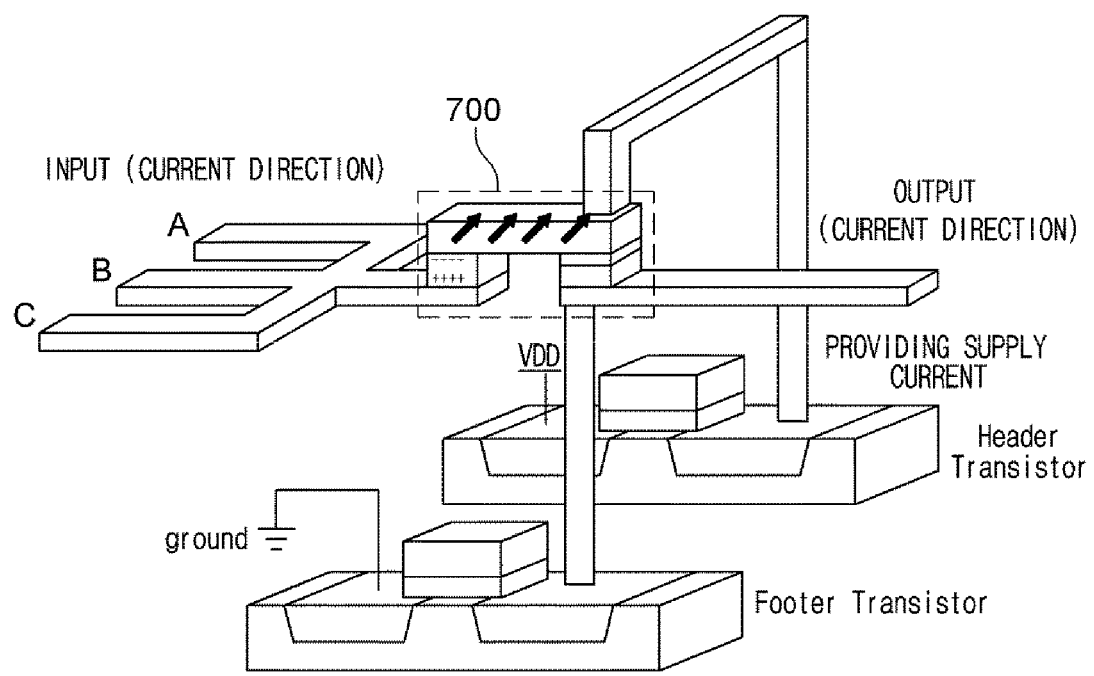

[FIG. 10]
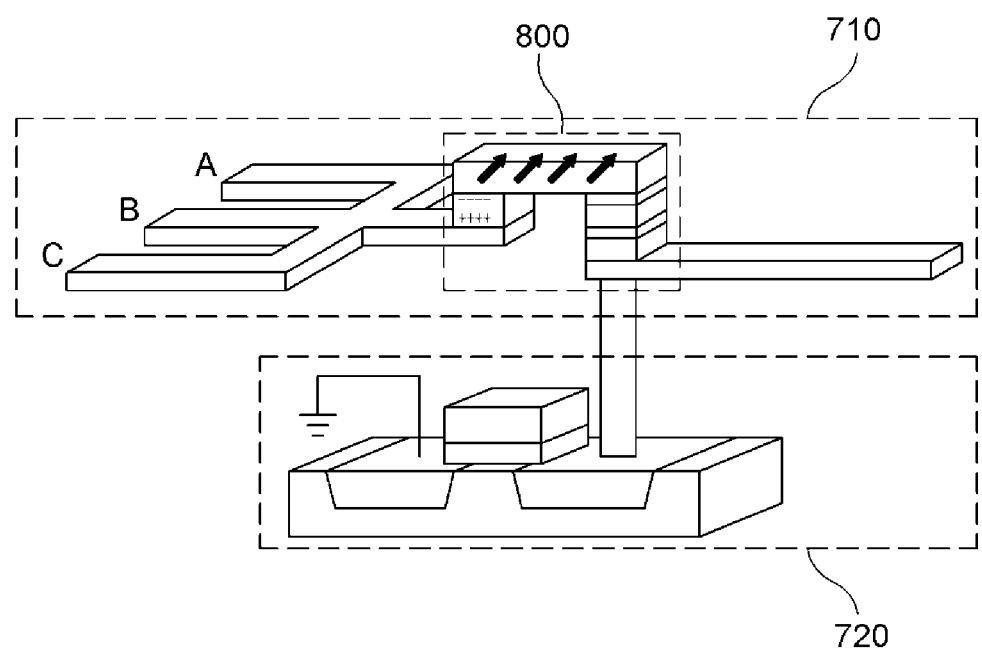

[FIG. 11A]
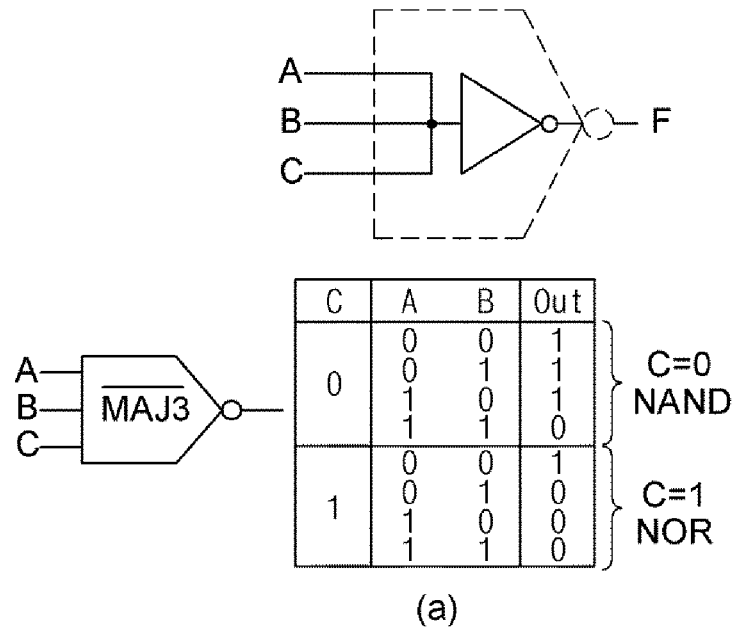
(a)
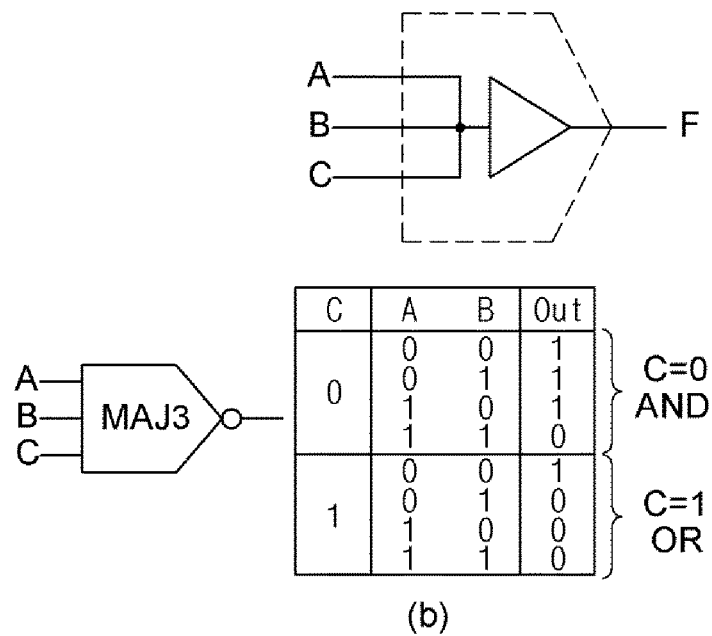
(b)

【FIG. 11B】
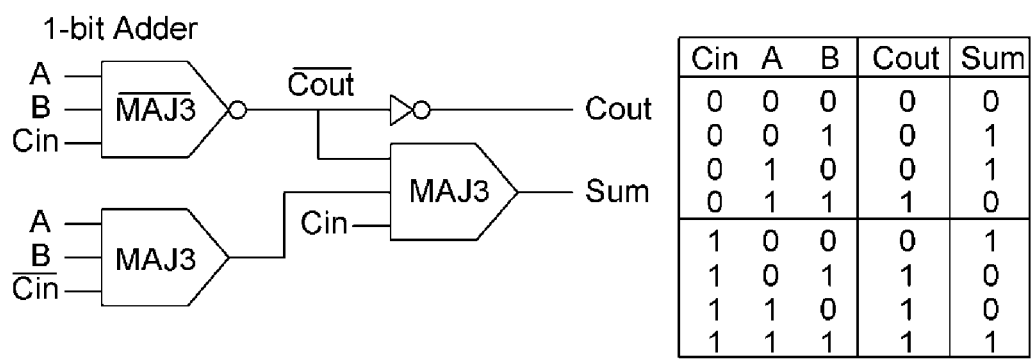

【FIG. 12A】
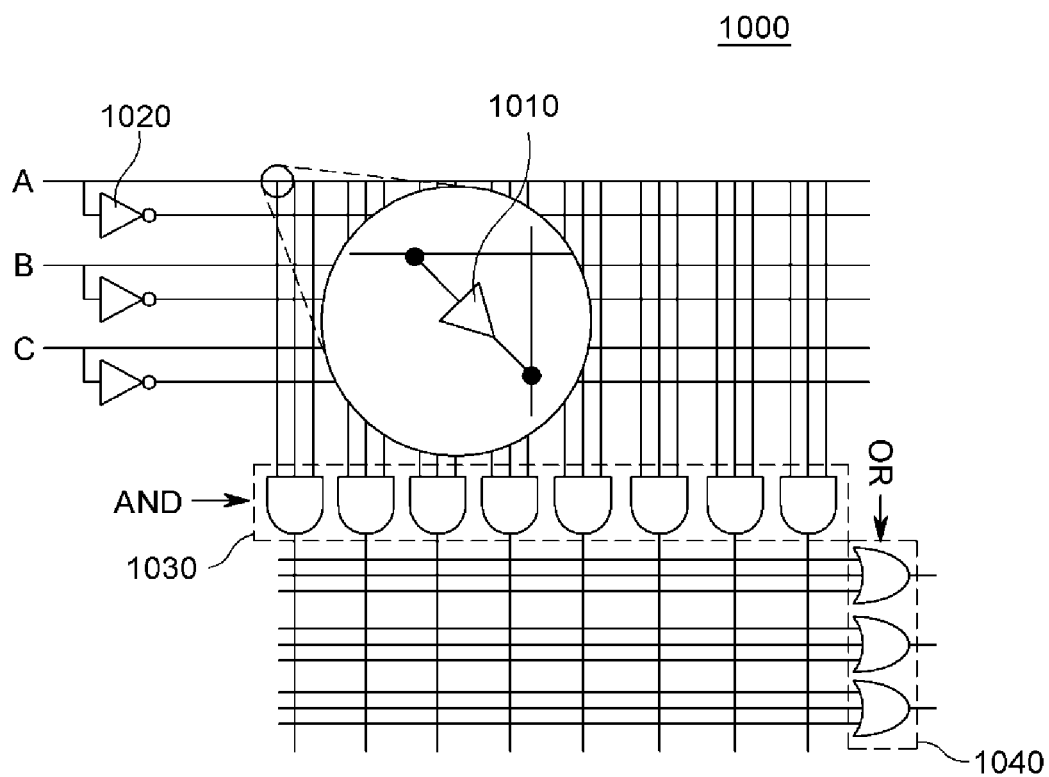

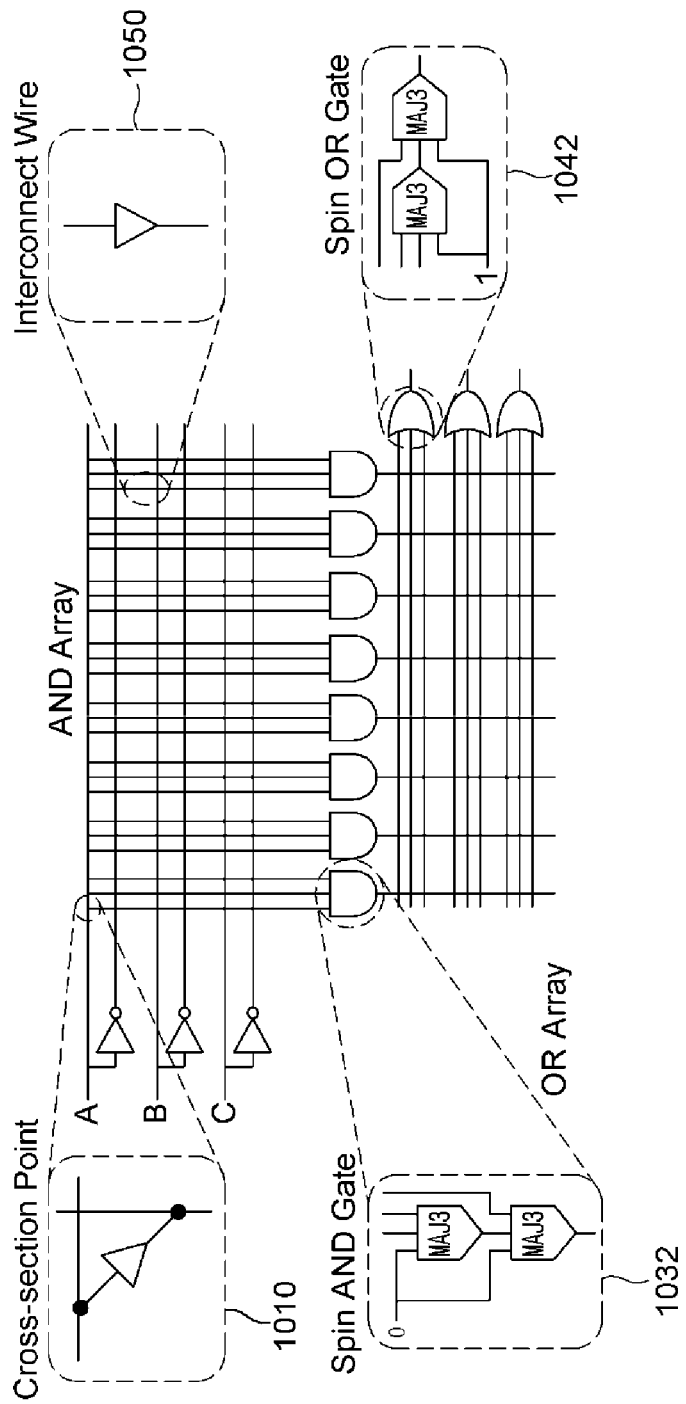
[FIG. 12B]

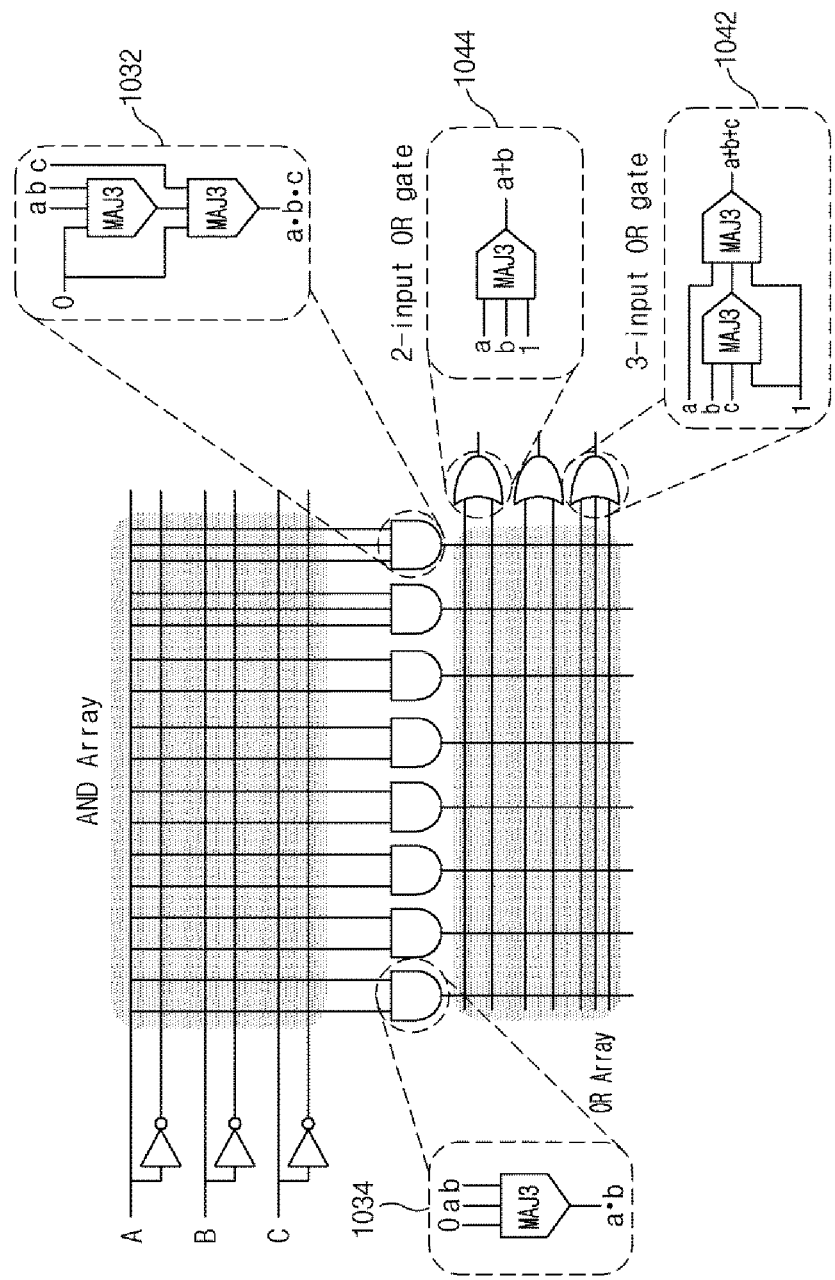
[FIG. 12C]

[FIG. 12D]
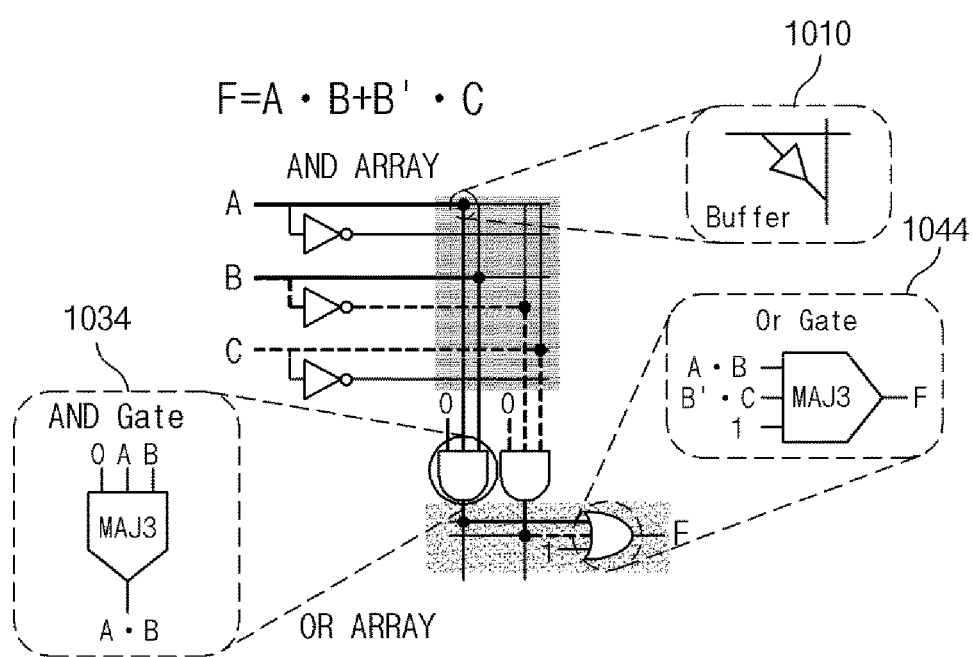

[FIG. 13A]
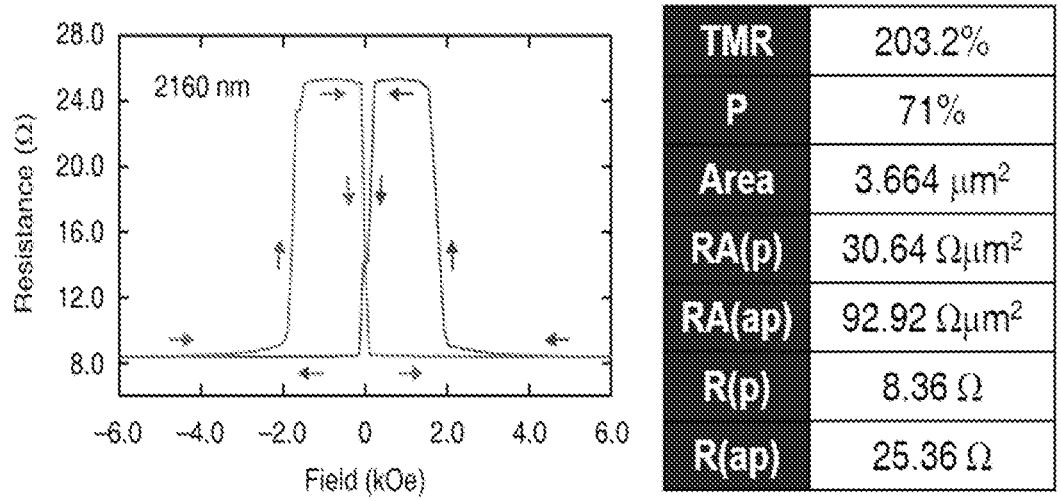

[FIG. 13B]
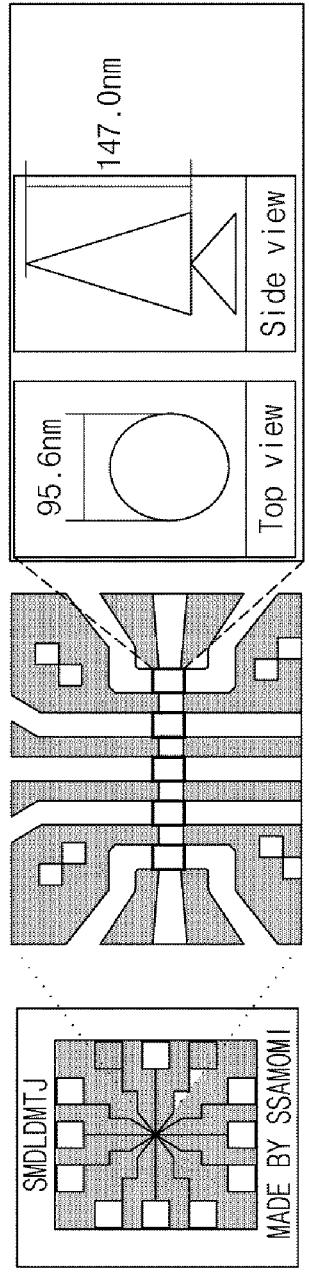
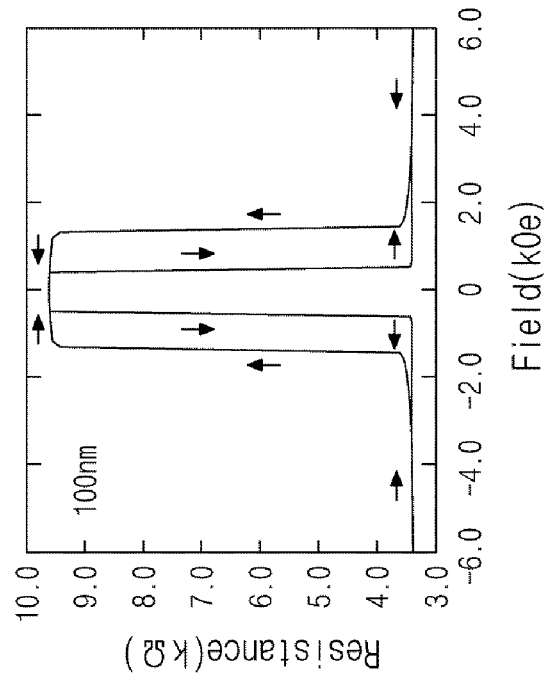
| TMR | 184.8% |
|---|---|
| P | 69% |
| Area | 0.00785 μm² |
| RA(p) | 26.57 Ω μm² |
| RA(ap) | 75.43 Ω μm² |
| R(p) | 3384.7 Ω |
| R(ap) | 9609.0 Ω |

[FIG. 13C]
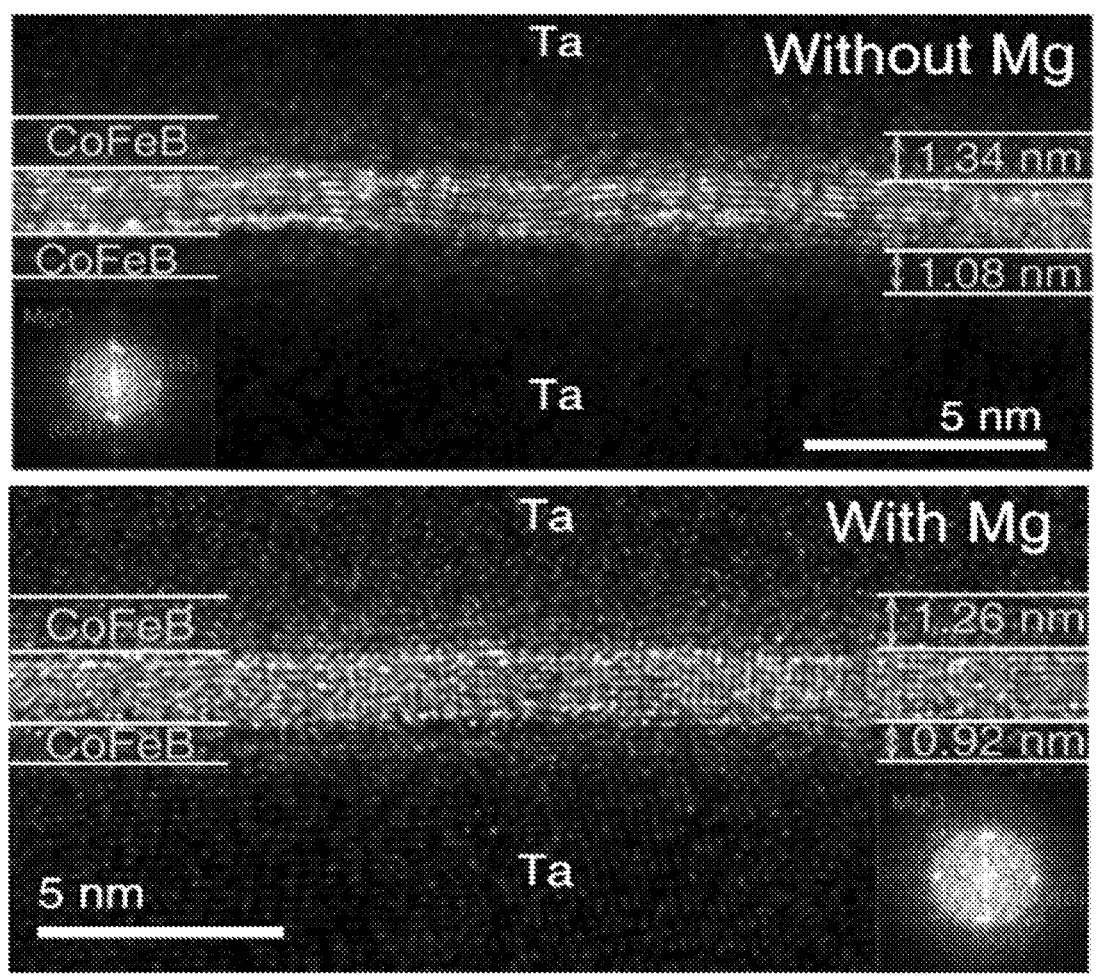

[FIG. 13D]
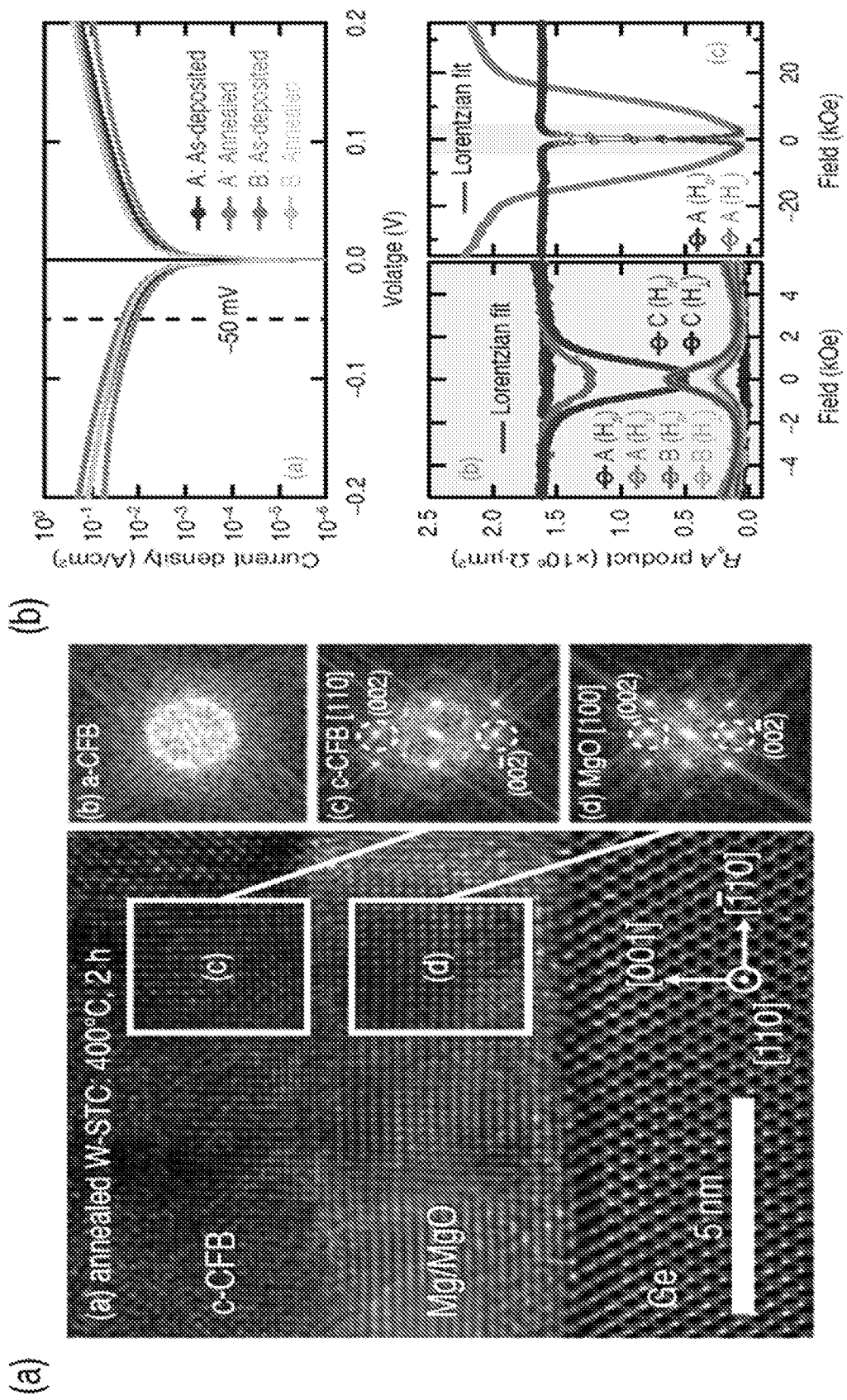

[FIG. 13E]
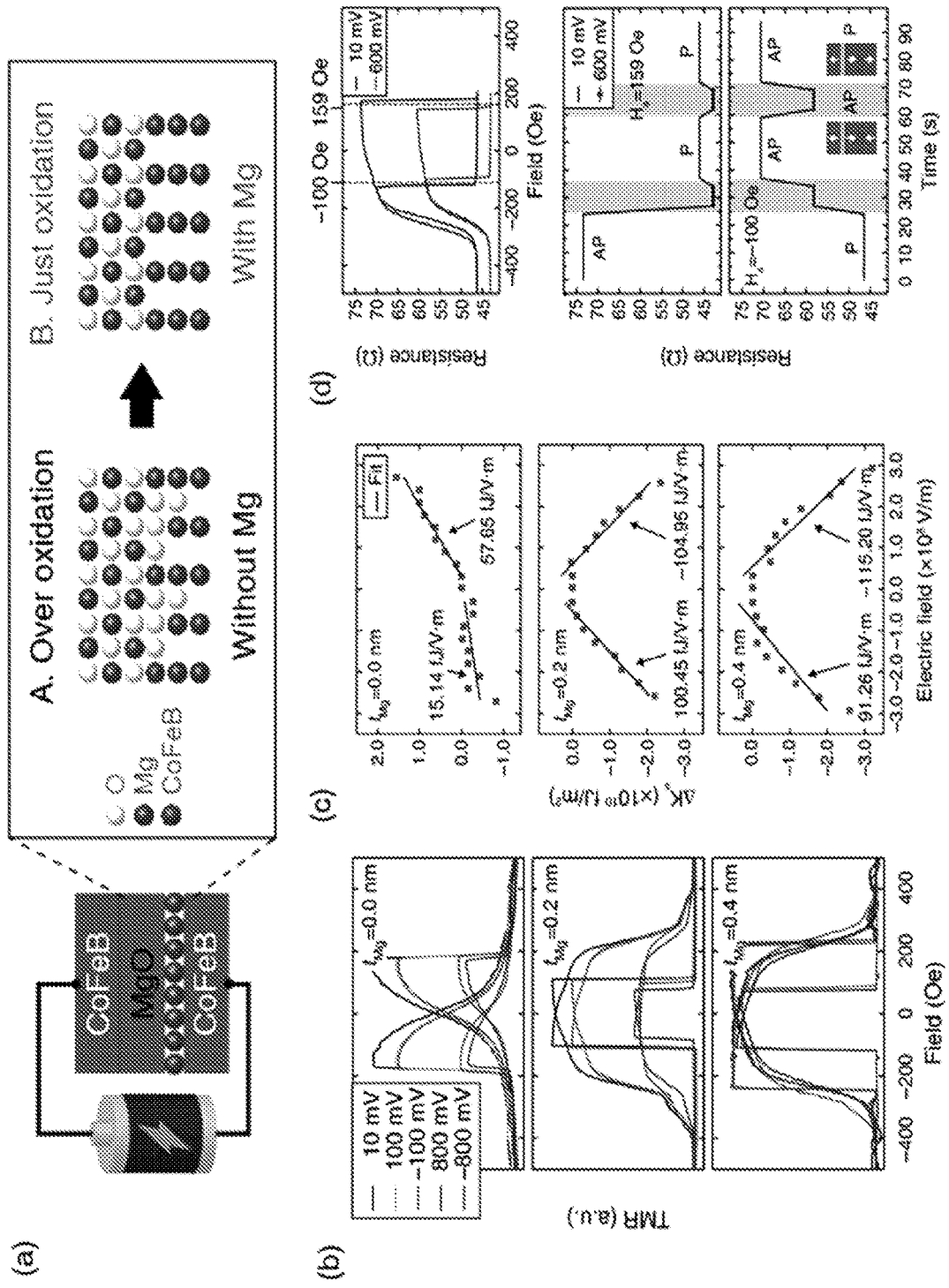

SPIN LOGIC DEVICE BASED ON SPIN-CHARGE CONVERSION AND SPIN LOGIC ARRAY USING THE SAME

CROSS-REFERENCE TO RELATED APPLICATIONS

This application is a continuation of U.S. patent application Ser. No. 16/875,415 filed on May 15, 2020, which claims priority to and the benefit of Korean Patent Application No. 10-2019-0057679 filed in the Korean Intellectual Property Office on May 17, 2019, Korean Patent Application No. 10-2019-0099458 filed in the Korean Intellectual Property Office on Aug. 14, 2019, and Korean Patent Application No. 10-2020-0005462 filed in the Korean Intellectual Property Office on Jan. 15, 2020, the entire contents of which are incorporated herein by reference.

TECHNICAL FIELD

The present invention relates to a spin logic device based on spin-charge conversion and a spin logic array using the same. This study is associated with Mid-sized researchers support project for Carbon electron and spin device using hydrogenated graphene intrinsic semiconductor (2019R1A2C2002960) and Industrial technology innovation business, industrial core technology development business and electronic information device industry source technology development business for Development of next-generation logic element source element technology below 5 nm (10067739).

BACKGROUND

Contents described in this section merely provide background information on an embodiment of the present invention and do not constitute the related art.

A MagnetoElectric Spin-orbit (MESO) logic device structure in the related art has a structure in which a ferromagnet (or a magnet) is deposited on a monocrystalline multiferroic material and its spin is switched by using the magneto-electric (ME) coupling in the multiferroic materials and the exchange coupling between multiferroic and the ferromagnetic spins. Although the MESO logic device structure is a theoretically great concept, the MESO logic device structure may not be fabricated in a back-end process in which transistors, the multiferroic materials and the magnets are integrated because of too high process temperature. To function as an element of spin logic, the multiferroic must be a single crystal and it requires a forming temperature of 700° C. or higher, which cannot be acceptable in the current Si technology process. For example, in the case bismuth iron oxide ($BiFeO_3$) mainly used in the MESO logic, its magnetization and electrical dipole moment are coupled by magneto-electric coupling. Bismuth iron oxide ($BiFeO_3$) shows a characteristic in that when an electric field is applied, the electric dipole moment is switched first and then the magnetization (or spin) coupled to that electric dipole moment is switched. However, in order to observe such a switching mechanics, bismuth iron oxide must be a single crystal which can be formed at a temperature of 700° C. or higher, and an oxygen pressure atmosphere of 100 mTorr or higher. In addition its thickness should be equal to or thicker than 100 nm. Such conditions are difficult to be provided during the semiconductor back-end process in the related art. It is thus difficult to apply bismuth iron oxide ($BiFeO_3$) for the device.

Meanwhile, the MESO logic device structure in the related art has a fatal disadvantage in that the endurance of the logic device cannot be guaranteed because a fatigue phenomenon occurs due to strain generated during switching. Further, the MESO logic device structure in the related art has another disadvantage in that since a sign of spin-charge conversion is either positive or negative, the logic device may be used only as an inverter but not as buffer.

SUMMARY

The present invention has been made in an effort to provide a spin-logic device based on spin-charge conversion, which converts spin current $I_S$ generated by an input source into charge current $I_C$ and outputs spin current determined by the magnetization of a magnet layer that is switched by an induced magnetic field and by an effective electric field induced in a dielectric layer by charge current and a reconfigurable spin logic array using the same.

An exemplary embodiment of the present invention provides a reconfigurable spin logic array including: an input terminal receiving at least three current signals; a plurality of wires transmitting the current signal in connection with the input terminal and including a horizontal wire and a vertical wire which cross each other; a first gate array in which at least one first majority gate connected to the input terminal through the wires and implemented based on the spin logic device is arranged; and a second gate array in which at least one second majority gate connected to the first gate array through the wires and implemented based on the spin logic device is arranged.

As described above, the present invention provides a new alternative device in a field of a voltage-driven magnetic device limited to a very small number of room-temperature operating multiferroics present in a natural world. The present invention may replace the multiferroics having a perovskite structure which is grown on a single crystal substrate in the related art, and can be directly mass produced by using a ferroelectric ultrathin film.

Further, the spin-logic device of the present invention can be adopted as a Beyond-CMOS device, because it can be operated by low switching power, low operating voltage without threshold voltage and low off-state power by power gating due to ferroelectric and magnetic non-volatile characteristics. Also, it can solve the conventional problem of high-power consumption by using a voltage control magnetic anisotropy phenomenon.

Further, according to an exemplary embodiment of the present invention, if the spin logic device using a spin switching and a synthetic antiferromagnet is incorporated with a memory technology, a new technology differentiated from the existing semiconductor architecture can be achieved.

Further, according to an exemplary embodiment of the present invention, the area and the driving power for the spin logic device can be remarkably reduced compared with a conventional device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 1 is a diagram illustrating a schematic view of a spin logic device according to an exemplary embodiment of the present invention.

FIG. 2A is a schematic view illustrating a spin logic device according to an exemplary embodiment of the present invention.

FIG. 2B is a diagram specifically illustrating a connection relationship of the spin logic device illustrated in FIG. 2A and a related circuit.

FIG. 3 is a diagram for describing a switching sequence of a magnet according to an exemplary embodiment of the present invention.

FIG. 4 is a diagram illustrating a schematic view of a spin logic device according to presence of a synthetic antiferromagnet in an exemplary embodiment of the present invention.

FIGS. 5A and 5B are diagrams illustrating a process in which a magnetization direction of a magnet layer is switched in response to input current and a process in which output current is generated according to the magnetization direction of a magnet.

FIG. 6 is a diagram illustrating a schematic view in which a spin inverter based on a spin logic device and a buffer are combined according to an exemplary embodiment of the present invention.

FIG. 7 is a flowchart for describing an operating method of a spin logic device according to an exemplary embodiment of the present invention.

FIG. 8A is an exemplary diagram illustrating a spin logic device based inverter unit circuit according to an exemplary embodiment of the present invention.

FIG. 8B is a diagram illustrating a buffer configured by using the spin logic device illustrated in FIG. 2A.

FIGS. 9A to 9C are diagrams illustrating a structure of an inverted majority gate adopting a spin logic device according to an exemplary embodiment of the present invention.

FIG. 10 is a diagram illustrating a structure of a non-inverted majority gate adopting a spin logic device according to an exemplary embodiment of the present invention.

FIGS. 11A and 11B are diagrams illustrating a majority gate implemented by using a spin logic device and a computation circuit of an adder according to an exemplary embodiment of the present invention.

FIGS. 12A to 12D are diagrams illustrating a reconfigurable spin logic array implemented by using a spin logic device according to an exemplary embodiment of the present invention.

FIGS. 13A and 13B are diagrams illustrating an experimental result of detecting spin current injected into a spin injection layer in a spin logic device using a magnetic tunnel junction structure according to an exemplary embodiment of the present invention.

FIG. 13C is a diagram illustrating a magnetic tunnel junction structure made for measuring the spin current injected on the spin injection layer in the spin logic device according to an exemplary embodiment of the present invention.

FIG. 13D is a diagram illustrating a result and a structure of detecting the spin current injected on the spin injection layer in the spin logic device in a Ge semiconductor according to an exemplary embodiment of the present invention.

FIG. 13E is a diagram illustrating a result of reducing the magnetic anisotropy energy of a magnet layer with applied voltage and performing spin switching in an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, a preferred embodiment of the present invention will be described in detail with reference to the accompanying drawings. In the following description, a detailed explanation of related known configurations or functions may be omitted to avoid obscuring the subject matter of the present invention. Further, hereinafter, the preferred embodiment of the present invention will be described, but the technical spirit of the present invention is not limited thereto or restricted thereby and the embodiments can be modified and variously executed by those skilled in the art. Hereinafter, a spin logic device based on spin-charge conversion and an operating method thereof proposed in the present invention will be described in detail with reference to the accompanying drawings.

FIG. 1 is a diagram illustrating a schematic view of a spin logic device according to an exemplary embodiment of the present invention.

The spin logic device 100 according to the exemplary embodiment includes a first conversion node 101, a second conversion node 102, and a connector 170 connecting the first conversion node 101 and the second conversion node 102.

The first conversion node 101 of the spin logic device 100 according to the exemplary embodiment as a node which is injected with spin current according to an input source, converts the spin current into charge current through the first conversion layer and outputs the charge current is constituted by a first magnet layer 110, first conversion layers 120 and 130, and the connector 170. Here, the first conversion layers 120 and 130 include a spin injection layer 120 and a spin-charge conversion layer 130.

The first conversion node 101 is injected with the spin current through the spin injection layer 120 and performs an operation of converting the spin current into the charge current through the spin-charge conversion layer 130 and outputting the charge current.

The first conversion node 101 supplies the spin current from the top to the bottom of an output terminal. The spin injection layer 120 may be implemented as an MgO based insulating layer for injection of the spin current and may be a spin filter for spin-dependent tunneling.

The first conversion node 101 of the spin logic device 100 is injected with the spin current through the spin injection layer and performs an operation of converting the spin current into the charge current through the spin-charge conversion layer and outputting the charge current. Here, the first conversion node 101 may be a structure including a synthetic antiferromagnetic layer, the spin injection layer adjacent to the synthetic antiferromagnetic layer, the spin-charge conversion layer, and a connector connecting the output terminal and an input terminal.

The first magnet layer 110 has a predetermined magnetization direction and generates the spin current depending on an input source and the magnetization direction. Here, the first magnet layer 110 is preferably formed by a ferromagnet.

The first magnet layer 110 may be formed as a single magnet or a synthetic antiferromagnet.

When the first magnet layer 110 is formed by the single magnet, the spin logic device 100 is implemented as an inverter that performs a logic value inversion function of a signal. Meanwhile, when the first magnet layer 110 is formed by the synthetic antiferromagnet, the spin logic device 100 may be implemented as a buffer that performs a function of adjusting impedance while maintaining the logic value of the signal. Here, the synthetic antiferromagnet may be a spin valve in which two magnets having magnetizations antiparallel to each other are implemented to be separated by a non-magnet positioned therebetween, but is not particularly limited thereto.

The first conversion layers 120 and 130 convert the spin current into the charge current. The spin injection layer 120 injects the spin current determined according to a predetermined magnetization direction by using a spin filter. The spin-charge conversion layer 130 converts the injected spin current into the charge current.

The second conversion node 102 of the spin logic device 100 according to the exemplary embodiment as a node which outputs the spin current by performing magnetization switching of the magnet by an induced or stray magnetic field induced by the charge current is constituted by a second magnetic layer 112, a dielectric layer 140, a cladding magnet layer 150, and the connector 170. The induced or stray magnetic field in this case may be referred to as the write magnetic field.

In the second conversion node 102, charges are accumulated at a surface of the dielectric layer 140 based on an electrical dipole polarization phenomenon by the input charge current and the magnetization direction of the magnet layer 112 is switched by an effective electric field and the write magnetic field. The effective electric field is produced by the accumulated charges at the interface between the dielectric and the magnet and it reduces the magnetic anisotropy energy of the magnet layer 112. The write magnetic field is induced by the current flowing in the cladding magnet 150 or in the connector 170. When the magnetization direction of the magnet is switched, the spin current is generated in the direction opposite to the spin current generated in the first conversion node 101.

The second conversion node 102 of the spin logic device 100 may perform an operation of performing magnetization switching by the write magnetic field induced by the charge current.

The second magnet layer 112 has a predetermined magnetization direction and generates the spin current whose direction is determined by the magnetization direction. Here, the second magnet layer 112 is preferably formed by the ferromagnet.

In the dielectric layer 140, the charges induced according to the charge current are accumulated at the interface between the dielectric layer and the second magnet layer and the accumulated charges serve as the effective electric field that reduces the magnetic anisotropy energy of the second magnet layer, thereby achieving the magnetization switching. Here, the dielectric layer 140 is preferably made of a ferroelectric material.

Specifically, the dielectric layer 140 accumulates the charges with the charge current input from the connector 170 and the charges are induced to an interface with the second magnet layer 112 due to the electrical dipole polarization phenomenon. Here, the effective electric field generated by the accumulated charges reduces the magnetic anisotropy energy of the second magnet layer 112 to make magnetization switched.

The cladding magnet layer 150 covers the connector 170 in which the charge current flows and has a soft magnetic cladding conductor structure. Here, the cladding magnet layer 110 is preferably formed by the ferromagnet.

The cladding magnet layer 150 produces the write magnetic field by the charge current which flows in the connector 170. When the effective electric field reduces the energy, the formed write magnetic field produced by the cladding magnet layer 150 switches the magnetization of the second magnet layer 112. The direction of spin current is determined according to the magnetization direction.

The spin current output from the second conversion node 102 may be used as the input source of the conversion node. Here, the conversion node using the spin current as the input source may be the first conversion node 101, but may be a new conversion node connected to the second conversion node 102 in a cascade scheme.

The first conversion node 101 and the second conversion node 102 of the spin logic device 100 according to the exemplary embodiment may be connected through the connector 170. Here, the connector 170 may be an electrode in which the charge current flows, but is not particularly limited thereto.

The spin logic device 100 according to the exemplary embodiment as a device that switches the magnet by the effective electric field and the write magnetic field generated by the input current and then outputs the charge current converted from the generated spin current by the spin-charge conversion effect is a unit logic device that may operate at a Curie temperature of the magnet or lower. For example, when the magnet is Fe, the Curie temperature is 1044 K.

The operation of the spin logic device 100 is performed as follows.

In the spin logic device 100, charges are accumulated at the interfaces between the electrode and the ferroelectric material and between the ferroelectric materials and the magnet with the input charge current $I_C$. Here, the charge current $I_C$ may be the current generated by the spin-charge conversion effect and flows to the electrode of the input terminal to accumulate the charges at the interfaces between interface of the electrode and the ferroelectric material and between the ferroelectric materials and the magnet.

In the spin logic device 100, the magnetization switching (or spin switching) is performed in the magnet based on the electrical dipole polarization phenomenon of the ferroelectric material. Specifically, in the spin logic device 100, the accumulated charges at the interface between the ferroelectric material and the magnet by the electrical dipole polarization phenomenon of the ferroelectric material serve as the effective electric field that reduces the magnetic anisotropy energy of the magnet and in this case, the magnetization of the magnet is decisively switched by the write magnetic field induced by the charge current which flows in the input terminal.

In the spin logic device 100, the spin current $I_S$ generated by the magnet may be injected into a spin injection structure (output terminal) located on an opposite side and then converted into the charge current $I_C$ as an output in the spin-charge conversion layer. Here, the spin logic device 100 uses the charge current $I_C$ converted in the spin-charge conversion layer as an input signal again to configure a computation cycle.

The spin logic device 100 according to the exemplary embodiment operates based on a technology of switching the magnet, a technology of spin-charge conversion, and a spin logic circuit technology.

The technology of switching the magnet of the spin logic device 100 is a technology that is subjected to electrical dipole polarization of the ferroelectric material by using a high-quality ferroelectric thin film and a magnetic thin film junction structure. In this case, the charges accumulated at the ferroelectric material/magnet interface serve as the effective electric field that reduces the magnetic anisotropy energy and switches the magnetization of the magnet together with the write magnetic field naturally generated in the soft magnetic cladding conductor structure or in the conductor structure. The technology of switching the magnet corresponds to a low-power technology. The technology of switching the magnet may include a ferroelectric material synthesis technology, a magnetic flux concentration technology using the soft magnetic cladding structure, a magnet magnetic anisotropy control technology, and the like.

In the spin logic device 100 according to the exemplary embodiment, in the ferroelectric material/magnet structure, as an interface electronic structure is changed by the effective electric field generated by the charges accumulated at the interface, the magnetic anisotropy energy of the magnet may be reduced. Here, reducing the magnetic anisotropy energy is different from a principle of using the interlayer exchange coupling. As a polarization direction of the ferroelectric material is changed while write magnetic field is applied, the magnetization of the magnet may be switched 180°.

The spin logic device 100 according to the exemplary embodiment finally includes a high-quality $(Hf,Zr)O_2$ thin film having a high residual polarization value and a relatively low operating voltage characteristic in an ultrathin film of 10 nm or less by using an atomic layer deposition (ALD) method or a pulse laser deposition (PLD) method effective for manufacturing the thin film and implements the magnetization switching by a technology of controlling magnetic anisotropy in a heterogeneous junction structure with a magnetic ultrathin film. Here, the $(Hf,Zr)O_2$ thin film as a new material in which a ferroelectric property was found in the 2010s has a high residual polarization (10 to 25 $\mu C/cm^2$) even in 20 nm or less. Even when $(Hf,Zr)O_2$ is deposited with an ultrathin film of 20 nm or less primarily by using the atomic layer deposition method, $(Hf,Zr)O_2$ has the ferroelectric property.

The technology of spin-charge conversion of the spin logic device 100 is a technology that injects the spin current determined according to the magnetization direction of the magnet layer with high efficiency and then converts the spin current into the charge current by an inverse spin-Hall effect (or the Inverse Rashba-Edelstein effect). Here, the technology of spin-charge conversion corresponds to a low-power and high-output technology. The technology of spin-charge conversion may include a synthesis technology of the magnetic layer or the synthetic antiferromagnetic layer, a synthesis technology of the insulating layer, a high-spin current forming technology (low power) using a spin filter layer, a spin-charge conversion material forming technology (high output), and the like.

The spin logic device 100 according to the exemplary embodiment may be used for implementing a circuit that may switch the magnetization with voltage and reconfigure a Boolean function such as an inverter/buffer/NAND/NOR/AND/OR using the spin-charge conversion in real time so as to be used in a low power and high-area efficiency application field.

The spin logic device 100 according to the exemplary embodiment has the following differentiation compared with a MagnetoElectric Spin-Orbit (MESO) device in the related art.

The spin logic device 100 may include a switching structure using ferroelectric materials instead of multiferroic materials, and as a result, the existing silicon based process technology may be applied to the spin logic device 100.

The spin logic device 100 may operate by a spin-charge conversion scheme that implements a structure of a spin current generation layer with the synthetic antiferromagnet. In the spin logic device 100, when the spin current generation layer is configured by the synthetic antiferromagnet, positive or negative signs of output charge current may be implemented even though the same spin-charge conversion layer is used. In other words, in the spin logic device 100, both the positive and negative signs of the charge current may be implemented by applying the synthetic antiferromagnet. For example, in the spin logic device 100, when the magnet is used, if positive charge current is output, negative charge current may be output when the synthetic antiferromagnet is used. For example, in the spin logic device 100, when the magnet is used, if the negative charge current is output, positive charge current may be output when the synthetic antiferromagnet is used. Therefore, the spin logic device 100 may be implemented as both the inverter and the buffer.

Further, the spin logic device 100 includes a cladding electrode structure for the write magnetic field. In the spin logic device 100 according to the exemplary embodiment, the magnetization switching occurs only in a cell in which the magnetic anisotropy energy of the magnet is reduced by interface charges of the dielectric. As a result, there is no interference problem among adjacent cells. Current applied for the write magnetic field is not current applied from the outside but the charge current input through the input terminal and the current itself induces the write magnetic field.

In the spin logic device 100 according to the exemplary embodiment, since the write magnetic field serves only to determine a switching direction while the magnetic anisotropy energy is maximally reduced by the ferroelectric material, the spin logic device 100 has a clear differentiation from the cladding structure in the related art. Meanwhile, in the spin logic device 100, when reduction of the magnetic anisotropy energy by the ferroelectric material is not sufficient, the write magnetic field may assist the switching.

The spin logic device 100 may accumulate charges by applying the ferroelectric material at the input terminal. For example, the spin logic device 100 may be used as the $(Hf,Zr)O_2$ ferroelectric material, and as a result, the spin logic device 100 may be implemented in combination with the existing semiconductor process. Further, in the spin logic device 100, as the ferroelectric material in which a fatigue phenomenon is reduced is used instead of the multiferroic material, the decisive switching may be operated by the write magnetic field.

FIG. 2A is a schematic view illustrating a spin logic device according to an exemplary embodiment of the present invention.

The spin logic device of FIG. 2A means a logic device that switches a magnetization direction by a spin-orbit torque. Here, the spin logic device of FIG. 2A may be implemented to include a current transmission layer 141 instead of the dielectric layer 140 of FIG. 1.

FIG. 2A illustrates a structure in which the first conversion node 101 and the second conversion node 102 of FIG.

1 are connected to the magnet layer 110. Referring to FIG. 2A, the spin logic device 100 includes the magnet layer 110, the current transmission layer 141, the spin injection layer 120, the spin-charge conversion layer 130, and the current output layer 180.

The magnet layer 110 may have a predetermined magnetization direction at the beginning.

The magnetization direction of the magnet layer 110 may be switched by current which flows through the current transmission layer 141. Specifically, the magnetization direction of the magnet layer 110 may be switched by the spin current or the spin-orbit torque generated by the current which flows through the current transmission layer 141.

The magnet layer 110 is preferably formed by the magnet.

The current transmission layer 141 may be formed on one surface of the magnet layer 110 and may be formed to be separated from the spin injection layer 120.

The current transmission layer 141 makes current supplied from a current supply unit 200 flow to the ground as illustrated in FIG. 2B. In this case, the current transmission layer 141 makes the spin current corresponding to a direction of the current supplied from the current supply unit 200 to switch the magnetization direction of the magnet layer 110.

The current transmission layer 141 is preferably made of heavy metals or topological insulators.

The spin injection layer 120 may be formed on one surface of the magnet layer 110 and may be formed to be separated from the current transmission layer 141.

The spin injection layer 120 may be injected with the spin current from the magnet layer 110. Specifically, the spin injection layer 120 as the spin filter allows the spin current having the direction corresponding to the magnetization direction of the magnet layer 110 to pass therethrough.

The spin injection layer 120 may be formed by an MgO based insulating layer.

The spin-charge conversion layer 130 may be formed underneath the spin injection layer 120.

The spin-charge conversion layer 130 may convert the spin current injected through the spin injection layer 120 into the charge current and output the charge current. Specifically, the spin-charge conversion layer 130 converts the spin current passing through the spin injection layer 120 into the charge current through a spin orbit interaction.

The current output layer 180 may be formed on the spin-charge conversion layer 130.

The current output layer 180 outputs the charge current converted by the spin-charge conversion layer 130.

The current output layer 180 may be made of a material in which the charge current may flow.

Meanwhile, a spin logic device according to another exemplary embodiment as a spin logic device that switches by the spin-orbit torque may be implemented to include a current transmission layer 141.

The current transmission layer 141 may be made of a material having large spin-orbit coupling. Here, the current transmission layer 141 may be made of the heavy metals or topological insulators. Current is supplied to the current transmission layer 141 from the current supply unit 200 and the current flows to the ground. In this case, the spin current may be made, which corresponds to the direction of the current supplied from the current transmission layer 141 or the current supply unit 200.

The current transmission layer 141 may be made of heavy metals or topological insulators and the spin injection layer 120 may be formed on one surface of the magnet layer 110 and may be formed to be separated from the current transmission layer 141.

The spin injection layer 120 may be injected with the spin current from the magnet layer 110. Specifically, the spin injection layer 120 as the spin filter allows the spin current of the magnet layer 110 to pass therethrough.

The spin injection layer 120 may be formed by the MgO based insulating layer.

The spin-charge conversion layer 130 may be formed underneath the spin injection layer 120.

The spin-charge conversion layer 130 may convert the spin current injected through the spin injection layer 120 into the charge current and output the charge current. Specifically, the spin-charge conversion layer 130 converts the spin current passing through the spin injection layer 120 into the charge current through the spin orbit interaction.

The current output layer 180 may be formed on the spin-charge conversion layer 130.

The current output layer 180 outputs the charge current converted by the spin-charge conversion layer 130.

The current output layer 180 may be made of the material in which the charge current may flow.

Although not illustrated in FIG. 2A, the synthetic antiferromagnet may be replaced with the magnet layer 110 only in the spin injection structure. When the synthetic antiferromagnet is provided, the direction of the charge current which flows through the current output layer 180 may be inverted. In other words, the spin logic device 100 may be implemented as the inverter or the buffer according to whether the synthetic antiferromagnet is provided. For example, the synthetic antiferromagnet may be implemented as an artificial structure in which magnetization of two magnet layers are aligned to be opposite to each other in a magnet layer (i)/non-magnet layer/magnet layer (ii) structure by Ruderman-Kittle-Kasuya-Yosida coupling, where the magnetic layer (i) and (ii) may be the magnet layer 110 and the non-magnet layer may be the layer 114.

FIG. 2B is a diagram specifically illustrating a connection relationship of the spin logic device illustrated in FIG. 2A and a related circuit.

Referring to FIG. 2B, the current transmission layer 141 may be connected to the current supply unit 200 through the electrode 142 and connected to the ground through the electrode 144.

The current supply unit 200 may supply current corresponding to input current $I_{in}$ supplied through an input node IN to the current transmission layer 141 through the electrode 142.

According to an exemplary embodiment, the current supply unit 200 may supply, to the current transmission layer 141, current of a direction which is the same as a direction of the input current $I_{in}$.

The current supply unit 200 may include a capacitor C, a dependent power source DS, and a transmission transistor TM.

The capacitor C charges the input current $I_{in}$ supplied from the input node IN. In other words, the capacitor C stores voltage Vc corresponding to the input current $I_{in}$.

The dependent power source DS supplies power corresponding to the voltage Vc stored in the capacitor C.

According to an exemplary embodiment, the dependent power source DS may be a voltage source that outputs voltage with a polarity corresponding to a the polarity and magnitude of the voltage Vc stored in the capacitor C For example, when the voltage Vc is positive, the dependent power source DS may be a positive voltage source and when the voltage Vc is negative, the dependent power source DS may be a negative voltage source.

As another example, when the voltage Vc is equal to or higher than predetermined reference voltage, the dependent power source DS may operate as a power source having positive voltage and when the voltage Vc is lower than the predetermined reference voltage, the dependent power source DS may operate as a power source having negative voltage.

A gate electrode of the transmission transistor TM may be connected to the input node IN, a first electrode may be connected to the dependent power source DS, and a second electrode may be connected to the electrode 142.

The transmission transistor TM may supply current corresponding to the output voltage of the dependent power source DS to the electrode 142. The current may flow to the ground through the electrode 142, the current transmission layer 141, and the electrode 144.

When the current flows through the current transmission layer 141, the magnetization direction of the magnet layer 110 may be switched by the spin current or the spin-orbit torque generated by the current transmission layer 141. The direction of the spin current of the current transmission layer 141 is determined according to the direction of the current supplied from the transmission transistor TM.

A header transistor TH may be provided between the magnet layer 110 and a power source VDD and a footer transistor TF may be provided between the current output layer 180 and the ground.

The header transistor TH may be connected to the magnet layer 110 through an electrode layer 171 and the footer transistor TF may be connected to the current output layer 173 through an electrode layer 173.

The header transistor TH may be connected between the power source VDD and the electrode layer 171 and may be turned on in response to a control signal $V_{sup}$.

The footer transistor TF may be connected between the power source VDD and the electrode layer 173 and may be turned on in response to the control signal $V_{sup}$.

When the control signal $V_{sup}$ is supplied, the header transistor TH and the footer transistor TF are preferably formed in a vertical direction to the magnet layer 110, the spin injection layer 120, the spin-charge conversion layer 140, and the current output layer 180 so that vertical current $I_{sup}$ flows through the magnet layer 110, the spin injection layer 120, the spin-charge conversion layer 130, and the current output layer 180.

In FIG. 2B, a case where both the header transistor TH and the footer transistor TF are provided is illustrated, but the exemplary embodiment of the present invention is not limited thereto. For example, it is sufficient when only at least one of the header transistor TH and the footer transistor TF is provided.

The operation of the spin logic device 100 depending on the direction of the input current $I_{in}$ supplied from the input node IN will be described in more detail through FIGS. FIG. 5AA to FIG. 5BB.

FIG. 3 is a diagram for describing a switching sequence of a magnet according to an exemplary embodiment of the present invention.

FIG. 3A illustrates a state in which the charge current $I_C$ is not yet input as an initial state.

Referring to FIG. 3B, the second conversion node 102 of the spin logic device 100 accumulates the charges in the electrode/ferroelectric material interface and the ferroelectric material/magnet interface with the charge current $I_C$ output from the first conversion node 101. Here, the charge current $I_C$ may be current generated by the spin-charge conversion effect and flows to the electrode of the input terminal to induce the charges at the electrode/ferroelectric material interface and the ferroelectric material/magnet interface.

Referring to FIG. 3C, in the second conversion node 102 of the spin logic device 100, the magnetization switching (or spin switching) is performed in the magnet based on the electrical dipole polarization phenomenon of the ferroelectric material. Specifically, in the spin logic device 100, the charges induced at the interface between the ferroelectric material and the magnet by the electrical dipole polarization phenomenon of the ferroelectric material serve as the effective electric field that reduces the magnetic anisotropy energy of the magnet and in this case, the magnetization of the magnet is decisively switched by the write magnetic field induced by the charge current which flows in the input terminal.

Referring to FIG. 3D, the second conversion node 102 of the spin logic device 100 injects the spin current $I_S$ generated by the magnet into a spin injection structure (spin injection layer) of the first conversion node 101 located at an opposite side thereto.

The first conversion node 101 of the spin logic device 100 converts the injected spin current $I_S$ into the charge current $I_C$ through the spin-charge conversion layer and outputs the charge current. Here, the first conversion node 101 of the spin logic device 100 uses the charge current $I_C$ converted on the spin-charge conversion layer as an input signal again to configure a computation cycle.

When the spin injection layer provided in the first conversion node 101 is used as a single magnet, the spin logic device 100 may be operated as the inverter and when the spin injection layer is used as the synthetic antiferromagnet layer, the spin logic device 100 may be operated as the buffer and used for a logic computation circuit.

FIG. 4 is a diagram illustrating a schematic view of a spin logic device using a synthetic antiferromagnet in an exemplary embodiment of the present invention.

The spin logic device 100 according to the exemplary embodiment has a synthetic antiferromagnet composed of three layers 110, 114 and 110 for spin injection. The three layers 110, 114 and 110 have a structure in which a non-magnetic layer 114 is inserted between two magnet layers 110 and the magnetization direction of the two magnetic layers 110 is antiparallel to each other. The spin logic device 100 may implement both the inverter and the buffer without changing a material of spin-charge conversion according to presence of the synthetic antiferromagnet. FIG. 4A illustrates the inverter which is the spin logic device without the synthetic antiferromagnet and FIG. 4B illustrates the buffer which is the spin logic device using the synthetic antiferromagnet.

In the spin logic device in the related art, when the sign of the spin-charge conversion of the spin-charge conversion layer is determined, the sign or direction of the charge current output accordingly is determined as one without any choices, and as a result, in order to solve a problem that the spin logic device is used only one of the inverter and the buffer, the spin logic device 100 according to the exemplary embodiment may use a structure of the spin current generation layer (magnet) as the synthetic antiferromagnet.

When the synthetic antiferromagnet 110, 114 and 110 is used as the structure of the spin current generation layer, the spin logic device 100 may implement both the inverter and the buffer because a signal is made of which the sign of the converted charge current is opposite to the sign of the charge current in a case that the synthetic antiferromagnet is used even though the same spin-charge conversion layer is used. Here, the two magnets 110 are coupled through the nonmagnet 114 by a Ruderman-Kittel-Kasuya-Yosida (RKKY) interaction.

Further, synthetic antiferromagnet 110, 114 and 110 may enhance thermal stability of the magnetization in the magnet. In general, in the spin logic device, the magnetization should be stable at an operating temperature of 80° C. or higher and in general, a method for increasing the magnetic anisotropy energy of the magnet is used for the stable magnetization. However, this method has a disadvantage in that the switching of the magnet becomes difficult by the charges of the dielectric and the write magnetic field because of the large magnetic anisotropy energy. On the other hand, the spin logic device 100 according to the exemplary embodiment allows the write magnetic field to be continuously present at the input terminal, which stabilizes the magnetization until the switching is made. Meanwhile, when the magnet is replaced with the synthetic antiferromagnet, a thickness of the magnet layer is effectively increased, thereby increasing the thermal stability of the magnetization.

FIG. 5AA is a diagram illustrating one example of a process in which the magnetization direction of the magnet layer is switched by the spin-orbit torque in response to the input current. FIG. 5AA is a diagram for describing a process in which a magnetization direction Ms of the magnet layer 110 is switched when the input current $I_{in}$ flows from the input node IN to the current supply unit 200.

Referring to FIG. 5AA, when the input current $I_{in}$ is supplied from the input node IN to the current supply unit 200, the voltage Vc between both terminals of the capacitor C may be charged to a predetermined reference voltage or higher.

The dependent power source DS outputs voltage corresponding to the voltage Vc between both terminals of the capacitor C, i.e., positive voltage.

In this case, the transmission transistor TM as an N-channel MOSFET (NMOS) may amplify the input current $I_{in}$ and output the amplified input current to the spin logic device 100. Specifically, the transmission transistor TM may supply the amplified current $I_{tr}$ toward the ground through the electrode 142, the current transmission layer 141, and the electrode 144.

In the current transmission layer 141, when the amplified current $I_{tr}$ flows, the spin current or the spin-orbit torque is generated toward the amplified current $I_{tr}$. As a result, the magnetization direction Ms of the magnet layer 110 may be switched as illustrated in FIG. 5AA.

FIG. 5AB is a diagram illustrating one example of a process in which the output current is generated according to the magnetization direction of the magnet. FIG. 5AB is a diagram for describing a process in which the direction of output current $I_{out}$ is determined when the magnetization direction Ms of the magnet layer 110 is switched as illustrated in FIG. 5AA.

Referring to FIG. 5AB, when the vertical current $I_{sup}$ flows through the magnet layer 110, the spin injection layer 120, the spin-charge conversion layer 130, and the current output layer 180 after the magnetization direction Ms of the magnet layer 110 is switched, the output current $I_{out}$ may be generated.

The spin injection layer 120 may be injected with the spin current in the direction corresponding to the magnetization direction of the magnet layer 110. Specifically, the spin injection layer 120 as the spin filter may allow the spin current having the direction corresponding to the magnetization direction of the magnet layer 110 to pass therethrough.

The spin-charge conversion layer 130 converts the spin current passing through the spin injection layer 120 into the charge current and output the charge current. In this case, while the charge current output from the spin-charge conversion layer 130 flows through the current output layer 180, the charge current may serve as the output current $I_{out}$.

Since the direction of the input current $I_{in}$ illustrated in FIG. 5AA and the direction of the output current $I_{out}$ are opposite to each other, the spin logic device 100 may be appreciated as operating as the inverter.

FIG. 5BA is a diagram illustrating another example of a process in which the magnetization direction of the magnet layer is switched in response to the input current.

FIG. 5BA is a diagram for describing a process in which the magnetization direction Ms of the magnet layer 110 is switched when input current $I_{in}'$ flows from the current supply unit 200 to the input node IN.

Referring to FIG. 5BA, when the input current $I_{in}'$ is supplied from the input node IN to the current supply unit 200, the voltage Vc across both terminals of the capacitor C may be discharged below predetermined reference voltage.

The dependent power source DS outputs the voltage corresponding to the voltage Vc between both terminals of the capacitor C, i.e., negative voltage.

In this case, the transmission transistor TM as an NMOS may amplify the input current $I_{in}'$ and output the amplified input current to the spin logic device 100. Specifically, the transmission transistor TM may supply the amplified current $I_{tr}'$ toward the transmission transistor TM from the ground through the electrode 144, the current transmission layer 141, and the electrode 142. In other words, the transmission transistor TM may sink the current $I_{tr}'$ from the ground through the current transmission layer 141.

In the current transmission layer 141, when the amplified current $I_{tr}'$ flows, the spin current or the spin-orbit torque corresponding to the direction of the amplified current $I_{tr}'$ may be generated. As a result, the magnetization direction Ms of the magnet layer 110 may be switched as illustrated in FIG. 5BA.

FIG. 5BB is a diagram illustrating another example of the process in which the output current is generated according to the magnetization direction of the magnet. FIG. 5BB is a diagram for describing a process in which the direction of output current $I_{out}'$ is determined when the magnetization direction Ms of the magnet layer 110 is switched as illustrated in FIG. 5BA.

Referring to FIG. 5BB, when the vertical current $I_{sup}$ flows through the magnet layer 110, the spin injection layer 120, the spin-charge conversion layer 130, and the current output layer 180 after the magnetization direction Ms of the magnet layer 110 is switched, the output current $I_{out}'$ may be generated.

The spin injection layer 120 may be injected with the spin current in the direction corresponding to the magnetization direction of the magnet layer 110. Specifically, the spin injection layer 120 as the spin filter allows the spin current having the direction corresponding to the magnetization direction of the magnet layer 110 to pass therethrough.

The spin-charge conversion layer 130 converts the spin current passing through the spin injection layer 120 into the charge current and output the charge current. In this case, while the charge current output from the spin-charge conversion layer 130 flows through the current output layer 180, the charge current may serve as the output current $I_{out}'$.

Since the direction of the input current $I_{in}'$ illustrated in FIG. 5BA and the direction of the output current $I_{out}'$ are opposite to each other, the spin logic device 100 may be appreciated as operating as the inverter.

FIG. 6 is a diagram illustrating a schematic view of a spin inverter based on a spin logic device according to an exemplary embodiment of the present invention.

FIG. 6 illustrates a schematic view of a spin inverter which may operate at a Curie temperature of the magnet or lower. For example, when the magnet is Fe, the Curie temperature is 1044 K.

Referring to FIG. 6, the spin logic device 100 according to the exemplary embodiment switches the magnet with the effective electric field induced by the surface charge of the ferroelectric material/magnet and the write magnetic field induced by the input current and then outputs the generated spin current as the charge current by using the spin-charge conversion effect.

In FIG. 6, the inverter may be implemented by coupling a first node 510 and a second node 520, the buffer may be implemented by coupling the second node 520 and a third node 530, and an inverter-buffer structure may be implemented by connecting the first node 510, the second node 520, and the third node 530.

FIG. 7 is a flowchart for describing an operating method of a spin logic device according to an exemplary embodiment of the present invention.

The first conversion node 101 of the spin logic device 100 injects the spin current generated by the input source (S710) and converts the injected spin current into the charge current through the spin filter, the spin-orbit interaction, etc. (S720).

The first conversion node 101 transmits the charge current to the second conversion node 102 through the connector 170.

The second conversion node 102 of the spin logic device 100 induces the charges with the charge current flowing in the connector 170 by the electrical dipole polarization phenomenon of the ferroelectric (S740).

The second conversion node 102 forms the effective electric field in the induced charges and the cladding magnet layer of the soft magnet cladding conductor structure (S750).

The second conversion node 102 switches the magnetization of the magnet through the effective electric field and the formed write magnetic field (S760) and generates the spin current (S770).

In FIG. 7, it is described that respective steps are executed in sequence, but the present invention is not limited thereto. In other words, since it is applicable that the steps described in FIG. 7 are changed and executed or one or more steps are executed in parallel, FIG. 7 is not limited to a time series order.

FIG. 8A is an exemplary diagram illustrating a spin logic device based inverter unit circuit according to an exemplary embodiment of the present invention.

FIG. 8A illustrates an inverter unit circuit implemented by applying the spin logic device 100 using the ferroelectric 140.

Referring to FIG. 8A, the operation of the inverter unit circuit is as follows.

When current is input into the spin logic device 100 at a left side, polarization switching occurs in the ferroelectric 140. The charges are induced to both-terminal electrodes by internal polarization of the ferroelectric 140.

Magnetization switching energy is reduced by a voltage controlled magnetic anisotropy (VCMA) effect by the charges induced to the magnet 110 and the magnetization switching occurs by a direction of current which flows in a conductor or a cladding conductor structure.

Current vertically supplied by a transistor which operates by a $V_{sup}$ signal is applied to the magnet 110 and as the applied current, current in an opposite direction to the input current is output via the spin injection layer 120 and the spin-charge conversion layer 130. Therefore, the spin logic device 100 at the left side serves as a logic inverter that outputs an input (+1/−1 direction) as an opposite value (−1/+1).

In FIG. 8A, output current at a left side (front side) becomes input current at a right side (rear side) to be implemented in a form to satisfy concatenability of a logic stage.

FIG. 8B is a diagram illustrating a buffer configured by using the spin logic device illustrated in FIG. 2A. In FIG. 8B, two spin logic devices illustrated in FIG. 2B are connected in series and the current output layer 180 of a first stage (a left spin logic device 100-1) and the input node of a second stage (right spin logic device 100-2) may be appreciated as being electrically connected.

Referring to FIG. 8B, since each of the spin logic devices 100-1 and 100-2 operates as the inverter as described above, the direction of the input current $I_{in}$ and the direction of medium output current $I_{med}$ are opposite to each other and the direction of the medium output current $I_{med}$ and the direction of the output current $I_{out}$ are opposite to each other. In other words, the direction of the input current $I_{in}$ and the direction of the output current $I_{out}$ are the same as each other.

Through FIG. 8B, it can be seen that when even spin logic devices are connected in series, the spin logic devices may operate as the buffer.

FIGS. 9A to 9C are diagrams illustrating a structure of an inverting majority gate adopting a spin logic device according to an exemplary embodiment of the present invention.

FIG. 9A illustrates a structure of an inverting majority gate according to a first exemplary embodiment.

The inverting majority gate according to the first exemplary embodiment includes a first spin logic device 700 implemented as the inverter and a transistor. Here, the transistor has a structure of a footer transistor according to a supply current providing scheme of the first spin logic device 700.

As illustrated in FIG. 9A, in the inverting majority gate, a spin device level 710 includes a logic block implemented as the first spin logic device 700 implemented as the inverter and a substrate level 720 includes a transistor that performs a footer switch function. Here, the spin device level 710 may be located on an upper level (back-end) or on the same level (front-end) of the transistor process.

The footer transistor according to the first exemplary embodiment is connected between the first spin logic device 700 and a ground voltage source (Ground) and generates a virtual ground node with the first spin logic device 700. Specifically, the first spin logic device 700 is connected to the power voltage source VDD through a source electrode formed in a source of the transistor and a drain of the transistor is connected to the ground voltage source (Ground).

One end of the spin logic device is directly connected to a VDD voltage source and the other end is connected to the drain of the transistor 720. Here, the source of the transistor 720 is connected to the ground. For example, when the transistor 720 is NMOS, a high voltage side is continuously the drain and when the transistor 720 is PMOS, the high voltage side is the source.

The inverting majority gate according to the first exemplary embodiment may operate by the first spin logic device 700 which operates through three current inputs A, B, and C, and the footer transistor and the operation of the inverting majority gate may perform a NAND or NOR function as illustrated in FIG. 11AA.

FIG. 9B illustrates a structure of an inverting majority gate according to a second exemplary embodiment.

The inverting majority gate according to the second exemplary embodiment includes the first spin logic device 700 implemented as the inverter and the transistor. Here, the transistor has a structure of a header transistor according to the supply current providing scheme of the first spin logic device 700.

As illustrated in FIG. 9B, in the inverting majority gate, a spin device level 710 includes a logic block implemented as the first spin logic device 700 implemented as the inverter and a substrate level 720 includes a transistor that performs a header switch function. Here, the spin device level 710 may be located on an upper level (back-end) or on the same level (front-end) of the transistor process.

The header transistor according to the second exemplary embodiment is connected between the first spin logic device 700 and the power voltage source VDD and generates a virtual power source node with the first spin logic device 700. Specifically, the first spin logic device 700 is connected to the ground voltage source Ground through the source electrode formed in the source of the transistor and the drain of the transistor is connected to the power voltage source VDD.

One end of the spin logic device is directly connected to the ground voltage source Ground and the other end is connected to the source of the transistor. The drain of the transistor is connected to VDD.

The inverting majority gate according to the second exemplary embodiment may operate by the first spin logic device 700 which operates through three current inputs A, B, and C, and the header transistor and the operation of the inverting majority gate may perform the NAND or NOR function as illustrated in FIG. 11AA.

FIG. 9C illustrates a structure of an inverting majority gate according to a third exemplary embodiment.

The inverting majority gate according to the third exemplary embodiment includes the first spin logic device 700 implemented as the inverter and two transistors. Here, the transistor has the structures of the header transistor and the footer transistor according to the supply current providing scheme of the first spin logic device 700.

As illustrated in FIG. 9C, in the inverting majority gate, the spin device level 710 includes the logic block implemented as the first spin logic device 700 implemented as the inverter and the substrate level 720 includes the transistor that performs the header switch function and the transistor that performs the footer switch function. Here, the spin device level 710 may be located on an upper level (back-end) or on the same level (front-end) of the transistor process.

The header transistor according to the third exemplary embodiment is connected between the first spin logic device 700 and the power voltage source VDD and the footer transistor is connected between the first spin logic device 700 and the ground voltage source Ground.

The header transistor according to the third exemplary embodiment generates the virtual power source node with the first spin logic device 700 and the footer transistor generates the virtual ground node with the first spin logic device 700. Here, the drain of the header transistor is connected to the power voltage source VDD and the source of the footer transistor is connected to the ground voltage source Ground.

The inverting majority gate according to the third exemplary embodiment may operate by the first spin logic device 700 which operates through three current inputs A, B, and C, and the header transistor and the footer transistor and the operation of the inverting majority gate may perform the NAND or NOR function as illustrated in FIG. 11AA.

FIG. 10 is a diagram illustrating a structure of a non-inverting majority gate adopting a spin logic device according to a fourth exemplary embodiment of the present invention.

The non-inverting majority gate according to the fourth exemplary embodiment includes a second spin logic device 800 implemented as the buffer and the transistor. Here, the transistor may be the footer transistor, but may be changed depending on the supply current providing scheme of the second spin logic device 800 and may have one transistor structure of FIGS. 9A to 9C. Here, the second spin logic device 800 means the spin logic device 100 implemented as a buffer type by adopting the synthetic antiferromagnet 110, 114 and 110.

The non-inverting majority gate according to the fourth exemplary embodiment may operate by the second spin logic device 800 which operates through three current inputs A, B, and C, and the footer transistor and the operation of the non-inverting majority gate may perform an AND or OR function as illustrated in FIG. 11AB.

FIGS. 11A and 11B are diagrams illustrating a majority gate implemented by using a spin logic device and a computation circuit of an adder according to an exemplary embodiment of the present invention.

FIG. 11AA illustrates an inverting majority gate using the spin logic device 100 and FIG. 11AB illustrates a non-inverting majority gate using the spin logic device 100. Here, the spin logic device 100 used for the non-inverting majority gate of FIG. 11AB means a single device buffer formed based on the synthetic antiferromagnet.

The spin logic device 100 according to the exemplary embodiment may be implemented as a majority gate in order to extend an inverter circuit of the spin logic device 100 according to the exemplary embodiment to a logic circuit.

Referring to FIG. 11AA, the majority gate may configure the inverting majority gate by using three current inputs for the inverter implemented as the spin logic device 100.

In the inverting majority gate, when three current inputs meet in one node, multiple signals of three current signals are used as an input of a final inverter. The inverting majority gate may perform the NAND or NOR function according to a polarity (current direction) of C which is a tie-breaking signal.

In FIG. 11AA, the inverting majority gate may be implemented as a NAND gate having A and B as the inputs when one input (C) is fixed to 0. Here, the inputs A and B distinguish 0 and 1 in the current direction and an output F also has values of 0 and 1 in the current direction. Meanwhile, the inverting majority gate may be implemented as a NOR gate having A and B as the inputs when one input (C) is fixed to 1. Here, the inputs A and B distinguish 0 and 1 in the current direction and the output F also has the values of 0 and 1 in the current direction.

Referring to FIG. 11AB, the majority gate may configure the non-inverting majority gate by using three current inputs for the buffer implemented as the spin logic device 100.

In the non-inverting majority gate, when three current inputs meet in one node, multiple signals of three current signals are used as the input of a final buffer. The non-inverting majority gate using the final buffer may perform the AND or OR function according to the polarity (current direction) of C which is the tie-breaking signal.

In FIG. 11AB, the non-inverting majority gate may be implemented as an AND gate having A and B as the inputs when one input (C) is fixed to 0. Here, the inputs A and B distinguish 0 and 1 in the current direction and the output F also has the values of 0 and 1 in the current direction. Meanwhile, the non-inverting majority gate may be implemented as an OR gate having A and B as the inputs when one input (C) is fixed to 1. Here, the inputs A and B distinguish 0 and 1 in the current direction and the output F also has the values of 0 and 1 in the current direction.

FIG. 11B illustrates a 1-bit full adder using the spin logic device 100.

As illustrated in FIG. 11B, the full adder may be implemented by using three spin logic device 100 based majority gates. Here, the full adder may be implemented by connecting one inverting majority gate and two non-inverting majority gates. When a full adder circuit is configured by using the spin logic device 100, area efficiency may be enhanced by 5 times or 20 times compared with CMOS according to the design rule.

FIGS. 12A to 12D are diagrams illustrating a reconfigurable spin logic array implemented by using a spin logic device according to an exemplary embodiment of the present invention.

A normal Field Programmable Gate Array (FPGA) is constituted by a combinational logic block (CLB), routing, and I/O and the CLB is constituted by a lookup table (LUT), a D-flip flop (DFF), and a multiplexer (MUX).

The reconfigurable spin logic array 1000 according to the exemplary embodiment may be implemented by replacing some components of the field programmable gate array with the spin inverter, the spin buffer, the majority gate, etc., implemented by using the spin logic device 100.

The reconfigurable spin logic array 1000 according to the exemplary embodiment may design a reconfigurable logic expressing a plurality of Boolean functions having a plurality of inputs by using the spin inverter, the spin buffer, the majority gate, etc., implemented by using the spin logic device 100.

The reconfigurable spin logic array 1000 according to the exemplary embodiment may be configured to include an input terminal, a plurality of wires, a first gate array, and a second gate array. Specifically, the reconfigurable spin logic array 1000 may include an input terminal receiving at least three current signals, a plurality of wires transmitting the current signal in connection with the input terminal and including a horizontal wire and a vertical wire which cross each other, a first gate array in which at least one first majority gate connected to the input terminal through the wires and implemented based on the spin logic device is arranged, and a second gate array in which at least one second majority gate connected to the first gate array through the wires and implemented based on the spin logic device is arranged.

The input terminal may receive at least three current signals and correspond to a terminal that receives input values such as A, B, C, etc., in FIGS. 12A to 12D.

The input terminal may be connected to a first horizontal wire for transmitting the current signal for one input and a second horizontal wire in which a spin logic device based spin inverter for changing the current direction of the current signal is disposed.

The plurality of wires includes the horizontal wire and the vertical wire transmitting the current signal in connection with the input terminal and crossing each other.

The plurality of wires includes a wire connecting the first gate array and the second gate array. In the horizontal wire or the vertical wire, a spin logic device based wire spin buffer may be disposed, which serves as a repeater for maintaining a current value by considering wire resistance.

At a cross point formed by the horizontal wire and the vertical wire, a spin logic device based spin buffer may be disposed in a type connecting the horizontal wire and the vertical wire and the spin buffer serves to route a route of the current signal.

The first gate array may be connected to the input terminal through the wire and at least one first majority gate may be arranged, which is implemented based on the spin logic device.

The first gate array may include at least one first majority gate implemented by using at least one majority gate of the inverting majority gate adopting the inverter implemented based on the spin logic device and the non-inverting majority gate adopting the buffer implemented based on the spin logic device. Here, the first gate array may be implemented as a spin AND array 1030 in FIGS. 12A to 12D and the first majority gate may be implemented as a spin AND gate 1032, and an operator of the gate may be changed.

The second gate array may be connected to the first gate array through the wire and at least one second majority gate implemented based on the spin logic device may be arranged in the second gate array.

The second gate array may include at least one second majority gate implemented by using at least one majority gate of the inverting majority gate adopting the inverter implemented based on the spin logic device and the non-inverting majority gate adopting the buffer implemented based on the spin logic device. Here, the second gate array may be implemented as a spin OR array 1040 in FIGS. 12A to 12D and the second majority gate may be implemented as a spin OR gate 1042, and the operator of the gate may be changed.

The second gate array receives an output of the first gate array to output a predetermined function processing result and the function may be changed through adjustment of the first majority gate and the second majority gate.

In the reconfigurable spin logic array 1000 according to the exemplary embodiment, the spin logic device adopted for implementing each of the first majority gate and the second majority gate may include a first conversion node which is injected with the spin current depending on the input source and converts the spin current into the charge current through the first conversion layer and outputs the charge current and a second conversion node which magnetization switching the magnet layer by the induced magnetic field and the effective electric field induced by the charge current and outputs the spin current.

FIGS. 12A to 12D illustrate an exemplary embodiment of the reconfigurable spin logic array 1000 constituted by an AND array and an OR array.

Referring to FIG. 12A, the reconfigurable spin logic array 1000 includes a spin AND array 1030 and a spin OR array 1040.

Three input values A B, and C are determined as the direction of the current. When the input A passes through the spin inverter 1020, the input A becomes an input A' in which the current direction is changed. A spin buffer 1010 is disposed at every point where the horizontal wire and the vertical wire meet and when the horizontal wire and the vertical wire are routed, supply voltage and current of the spin buffer 1010 are applied to connect the current.

A plurality of AND gates and OR gates included in the spin AND array 1030 and the spin OR array 1040, respectively are the spin AND gate 1032 and the spin OR gate 1042 using a spin majority gate.

Referring to FIG. 12B, in the reconfigurable spin logic array 1000, the spin buffer 110 is disposed at every cross-section where the horizontal wire and the vertical wire cross each other.

The spin inverter 1020 for changing the current direction for each input is disposed at the input terminal of the reconfigurable spin logic array 1000. For example, when the input A passes through the spin inverter 1020, the input A becomes the input A' in which the current direction is changed.

The input inputted into the input terminal of the reconfigurable spin logic array 1000 is routed through the spin buffer 1010 disposed in the horizontal wire and the vertical wire and the routed input becomes an input of the spin AND gate 1032 included in the spin AND array 1030. Here, the reconfigurable spin logic array 1000 may fix one input of the spin AND gate 1032 included in the spin AND array 1030 to 0 in order to implement a predetermined Boolean function F which may be made by combining A, B, C, A', B', and C', but is not particularly limited thereto.

The output of the spin AND gate 1032 included in the AND array 1030 is routed through the spin buffer 1010 disposed in the horizontal wire and the vertical wire and the output of the routed output of the spin AND gate 1032 becomes the input of the spin OR gate 1042 included in the spin OR array 1040. Here, the reconfigurable spin logic array 1000 may fix one input of the spin OR gate 1042 included in the spin OR array 1040 to 1 in order to implement the predetermined Boolean function F which may be made by combining A, B, C, A', B', and C', but is not particularly limited thereto.

Meanwhile, it is illustrated that the spin AND gate 1032 and the spin OR gate 1042 of the reconfigurable spin logic array 1000 are implemented as two different non-inverting majority gates MAJ3 due to three inputs, but the present invention is not particularly limited thereto.

Referring to FIG. 12C, when one input is fixed, the reconfigurable spin logic array 1000 may be implemented by a 2-input spin AND gate 1034 and a 2-input spin OR gate 1044. For example, the 2-input spin AND gate 1034 may be implemented as one non-inverting majority gate MAJ3 in which one of three inputs is fixed to 0 and the 2-input spin OR gate 1044 may be implemented as one non-inverting majority gate MAJ3 in which one of three inputs is fixed to 1.

As illustrated in FIG. 12C, the reconfigurable spin logic array 1000 may be configured by mixing the spin AND gates 1032 and 1034 and the spin OR gates 1042 and 1044 having different numbers of inputs and the inputs of the gate may be implemented as three or more.

In other words, in the reconfigurable spin logic array 1000, n−1 non-inverting majority gates MAJ3 are required for configuring a spin AND gate or a spin OR gate having n (n is a natural number of 2 or more) inputs and it is preferable that wires for at least three inputs are present in each of the spin AND gate and the spin OR gate.

In the reconfigurable spin logic array 1000, a wire spin buffer 1050 may be additionally disposed in the middle of the wire. Here, the wire spin buffer 1050 serves as a repeater for maintaining the current value. For example, since lengths of wires for current of the input A and current of the input C to reach the spin AND gate 1032 are different from each other, the wire spin buffer 1050 serves as the repeater for maintaining the current value by considering the wire resistance.

In other words, in the reconfigurable spin logic array 1000, since the resistance may vary depending on the length of the wire and the intensity of a signal input from A and the intensity of a signal input from C may be different from each other, the wire spin buffer 1050 is disposed in the middle of the wire to prevent the signal intensity from being weakened. Here, whether the wire spin buffer 1050 is disposed may be determined according to the length or resistance of the wire and a disposition interval of the wire spin buffer 1050 may also be adjusted.

Referring to FIG. 12D, the reconfigurable spin logic array 1000 according to the exemplary embodiment represents a spin logic circuit that implements a predetermined function $F=A \cdot B + B' \cdot C$.

The reconfigurable spin logic array 1000 injects the supply current into a buffer at a point where the input A and an input wire of one spin AND gate 1034 cross each other and connects current of an input wire A and current of an input wire of the spin AND gate 1034 to route a current signal A to be input into the spin AND gate 1034.

The reconfigurable spin logic array 1000 injects the supply current into a buffer at a point where the input B and the input wire of one spin AND gate 1034 cross each other and connects current of an input wire B and current of the input wire of the spin AND gate 1034 to route a current signal B to be input into the spin AND gate 1034.

The reconfigurable spin logic array 1000 routes an inverted current signal of B as an input B' in which the current direction is changed when passing through the spin inverter 1020, and a current signal C as an input C to the input of another AND gate 1034.

Thereafter, the reconfigurable spin logic array 1000 routes two outputs of the spin AND gate 1034 to one input of the spin OR gate 1044 to make an output of a final function F.

The reconfigurable spin logic array 1000 may maintain the function value while maintaining the supply current of the spin buffer 1010 used for routing. Meanwhile, when the reconfigurable spin logic array 1000 changes the spin buffer 1010 used for routing and supplies the supply current to the corresponding buffer, the reconfigurable spin logic array 1000 may also express another function.

In other words, he reconfigurable spin logic array 1000 may make outputs for various functions according to the sizes of the spin AND array 1030 and the spin OR array 1040 and the number of input values and a reconfiguration therefor is possible.

The reconfigurable spin logic array 1000 according to the exemplary embodiment has an advantage in that pre-programming of LUT is not required and the area may be reduced as compared with the normal field programmable gate array. In the normal field programmable gate array, an SRAM cell (six transistors) and a pass transistor are required for every routing point, while in the reconfigurable spin logic array 1000 according to the exemplary embodiment, a chip implementation area may be remarkably reduced by replacing the routing point with one spin buffer 1010.

FIGS. 13A and 13B are diagrams illustrating an experimental result of detecting spin current injected from a spin injection layer in a spin logic device using a magnetic tunnel junction structure according to an exemplary embodiment of the present invention.

FIG. 13A illustrates a measurement result for a tunnel magnetic resistance ratio change of magnetic tunnel junction with an area of 3.7 µm². Referring to FIG. 13A, a magnetic tunnel junction (MTJ) composed of magnet/tunnel barrier (MgO)/magnet, a unit element of a Magnetic Random Access Memory (MRAM), is fabricated and its characteristics (tunnel magnetic resistance ratio change) are measured. In the magnetic tunnel junction fabricated, a resistance-area product (RA) of 30.7Ω·µm² and a tunnel magnetic resistance ratio of 203% are obtained. The ratio corresponds to a spin polarization rate (corresponding to the spin current) of 71%. In other words, 71% of applied current is converted into the spin current and is injected through an MgO tunnel barrier.

FIG. 13B illustrates a SEM image (upper) of a magnetic tunnel junction with a diameter of 100 nm and a change of the magnetic tunnel resistance ratio (lower). The 100 nm-wide magnetic tunnel junction is fabricated by using electron beam lithography. A spin polarization rate of 69% is achieved by obtaining a tunnel magnetic resistance ratio of 185% and an RA of 26.6Ω·µm². In other words, 69% of applied current is converted into the spin current and injected.

FIG. 13C is a diagram illustrating a magnetic tunnel junction structure made for measuring the spin current injected through the spin injection layer in the spin logic device according to an exemplary embodiment of the present invention.

In the spin logic device 100 according to the exemplary embodiment, for spin dependent tunneling, the MgO tunnel barrier should be used and the magnet and the MgO tunnel barrier should be grown in a good fit with (001) texture. For that, the spin logic device 100, a CoFeB/MgO/CoFeB structure having vertical and horizontal strong (001) texture may be adopted by using an atomic thick Mg insertion layer between MgO and CoFeB magnets (a lower electronic microscope picture of FIG. 13C).

In FIG. 13C, it can be seen by using cross-sectional high-resolution transmission electron microscopy (XHR-TEM) that the CoFeB/MgO/CoFeB structure has the vertical and horizontal strong (001) texture according to presence of the Mg insertion layer.

FIG. 13D is a diagram illustrating a result and a structure of detecting the spin current injected from the spin injection layer in the spin logic device in a Ge semiconductor according to an exemplary embodiment of the present invention.

FIG. 13DA is a diagram of observing a Ge/Mg/MgO/CoFeB structure by using XHRTEM and FIG. 13DB illustrates an experimental result of detecting a spin injected to Ge.

In injecting spin polarized current according to the exemplary embodiment into the semiconductor, an epitaxial growth between MgO which is the tunnel barrier and CoFeB which is a magnetic electrode may be facilitated by inserting the Mg layer. When interface control according to the exemplary embodiment is performed, spin injection efficiency may be enhanced by approximately 2.7 times as compared with the existing crystalline enhancement method such as heat treatment, etc. Further, as the lattice match of MgO in the plane is also enhanced in addition to the lattice match along the film normal by using the technology, a spin polarization of electrons in CoFeB is conserved when the electrons tunnel through the MgO and the efficiency of injection of the spin current into Ge which is the semiconductor is thereby increased through the conserved spin polarization. Further, it can be seen that atomic level interface control is important in a semiconductor spintronics field based on a spin injection technology.

FIG. 13E is a diagram illustrating a result of reducing magnetic anisotropy energy of a magnet with an applied electric field or voltage and performing spin switching in an exemplary embodiment of the present invention.

Referring to FIG. 13E, in CoFeB/MgO/CoFeB perpendicular magnetic tunnel junction having vertical magnetic anisotropy, an atomic thick Mg layer is inserted into an interface of CoFeB and MgO to change an oxygen amount and a tensile stress magnitude at the interface. When an external electric field is applied, a change of the magnetic anisotropy energy is measured. In particular, it can be seen that the Mg insertion layer changes a state of the interface from peroxidation to an appropriate oxidation state resulting in an increase of the perpendicular magnetic anisotropy energy of CoFeB by two times. Furthermore, a reduction of the magnetic anisotropy energy by an electric field is enhanced to a size of 100 fJ/V·m by six times. More importantly, because the tensile stress is released by the inserted Mg layer, a magnetic anisotropy energy reduction behavior by the electric field effect is changed from asymmetry to symmetry with respect to the polarity of the electric field. Operations of antiparallel to parallel or parallel to antiparallel magnetization switching may be proved by applying voltage having a magnitude of 600 mV (a threshold switching current density, Jc=1.9×10⁵ A/cm²) while an external magnetic field having magnitudes of 159 Oe and −100 Oe is applied. In other words, it can be seen that as the oxygen amount and the tensile stress magnitude at the interface are changed by inserting the Mg atomic layer between CoFeB and MgO, the power consumption required for a write operation of the device may be reduced.

FIG. 13EA is a schematic view of an external electric field effect for a magnetic tunnel junction device with the Mg insertion layer technology and FIG. 13EB illustrates a magnetic tunnel resistance ratio by an applied electric field. Further, FIG. 13EC illustrates a change of a magnetic anisotropy energy magnitude by the applied electric field and FIG. 13ED illustrates a antiparallel to parallel or parallel to antiparallel magnetization switching result of the magnetic tunnel junction while the magnetic anisotropy energy is reduced by applying voltage of 600 mV while applying magnetic field of 150 Oe and −100 Oe.

FIG. 13E proves a result in which the magnetic anisotropy energy of the magnet may be reduced by the charges according to an exemplary embodiment of the present invention. Here, the accumulated charges generate the effective electric field acting like the external electric field to change an electronic structure of the magnet, thereby reducing the magnetic anisotropy energy.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A spin logic device comprising:
a first conversion node includes a spin current injection layer which is a non-magnetic insulating layer and injected with spin current according to an input source, and a spin-charge conversion layer which converts the spin current into a charge current and outputs the charge current,
wherein the first conversion node includes:
a first magnet layer having a predetermined magnetization direction and generating the spin current by the input source:
the spin current injection layer injecting the spin current determined according to the predetermined magnetization direction;
the spin-charge conversion layer converting the spin current into the charge current based on an inverse spin-Hall effect; and
a connector transmitting the charge current from the first conversion node to a second conversion node in which magnetization of a second magnet layer is switched by a write magnetic field and an effective electric field induced by the charge current to output the spin current.

2. The spin logic device of claim 1, wherein the first conversion node performs the conversion of the spin current into the charge current through the spin-charge conversion layer and outputs the charge current.

3. The spin logic device of claim 1, the spin current injection layer comprises MgO or MgO based insulator.

4. The spin logic device of claim 3, wherein the MgO based insulator includes an atomic thick Mg insertion layer.

5. The spin logic device of claim 3, wherein the MgO or the MgO based insulator has (001) texture.

6. The spin logic device of claim 3, wherein the thickness of MgO is 2 nm or less.

7. The spin logic device of claim 1, wherein the first magnet layer is formed by a single magnet in order to perform a logic value inverting function of a signal.

8. The spin logic device of claim 1, wherein the first magnet layer is formed by a synthetic antiferromagnet in order to perform a function of adjusting impedance while maintaining a logic value of the signal.

9. The spin logic device of claim 1, wherein the second node includes:
the second magnet layer having a predetermined magnetization direction; and
a dielectric layer accumulating charges induced according to the charge current and reducing magnetic anisotropy energy of the second magnet layer by the induced charges to switch the magnetization of the second magnet layer.

* * * * *